(12) United States Patent
Murayama

(10) Patent No.: US 9,061,839 B2
(45) Date of Patent: *Jun. 23, 2015

(54) CEILING INSTALLATION TYPE ARTICLE TRANSPORT FACILITY

(71) Applicant: Daifuku Co., Ltd., Osaka-shi (JP)

(72) Inventor: Shigeto Murayama, Komaki (JP)

(73) Assignee: Daifuku Co., Ltd., Osaka-shi (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/716,869

(22) Filed: Dec. 17, 2012

(65) Prior Publication Data

US 2014/0090954 A1    Apr. 3, 2014

(30) Foreign Application Priority Data

Dec. 19, 2011  (JP) ................. 2011-277565

(51) Int. Cl.

| | |
|---|---|
| *B65G 47/61* | (2006.01) |
| *B65G 47/60* | (2006.01) |
| *B65G 35/06* | (2006.01) |
| *B65G 17/38* | (2006.01) |
| *H01L 21/677* | (2006.01) |
| *E01B 25/22* | (2006.01) |
| *E01B 25/26* | (2006.01) |

(52) U.S. Cl.
CPC .......... *B65G 47/61* (2013.01); *H01L 21/67715* (2013.01); *H01L 21/6773* (2013.01); *H01L 21/67733* (2013.01); *E01B 25/22* (2013.01); *E01B 25/26* (2013.01)

(58) Field of Classification Search
None
See application file for complete search history.

(56) References Cited

U.S. PATENT DOCUMENTS

| | | | |
|---|---|---|---|
| 5,445,080 A * | 8/1995 | Austin | 104/119 |
| 6,321,138 B1 * | 11/2001 | Livesay et al. | 700/245 |
| 8,701,864 B2 * | 4/2014 | Ogawa et al. | 198/370.1 |
| 2004/0107862 A1 | 6/2004 | Suh | |

FOREIGN PATENT DOCUMENTS

| | | |
|---|---|---|
| JP | 20006794 A | 1/2000 |
| JP | 200237059 A | 2/2002 |
| JP | 2004189209 A | 7/2004 |
| JP | 2011168173 A | 9/2011 |

* cited by examiner

*Primary Examiner* — Kavel Singh
(74) *Attorney, Agent, or Firm* — The Webb Law Firm

(57) ABSTRACT

Guide rails for an article transport vehicle are provided and include a pair of right and left rail portion which are spaced apart from each other in a rail lateral direction. The guide rails are diverged into a straight forward path, a left diverging path, and a right diverging path at a three-directional diverging portion of the travel paths. The pair of right and left rail portions provided along the straight forward path are spaced apart in the path longitudinal direction from the pair of right and left rail portions provided along the upstream-side travel path of the three-directional diverging portion. In addition, an auxiliary receiving mechanism is provided for receiving and supporting the article transport vehicle traveling between the pair of right and left rail portion of the upstream-side travel path and the pair of right and left rail portions of the straight forward path.

16 Claims, 15 Drawing Sheets

CEILING INSTALLATION TYPE ARTICLE TRANSPORT FACILITY

FIELD OF THE INVENTION

The present invention relates to an article transport facility of a ceiling installation type.

BACKGROUND

Article transport facilities of a ceiling installation type are installed, for example, in ceiling portions of clean rooms to transport, as articles, containers for housing and carrying substrates, such as semiconductor substrates. And, in such an article transport facility, diverging portions and converging portions are provided in travel paths to allow article transport vehicles to travel in various configurations. For example, a diverging portion and a converging portion are provided in the travel path to allow the article transport vehicle to travel by providing, e.g., a U-shaped travel path that diverges, or branches off, from a loop-shaped travel path and that extends by way of carry-in-and-out portions of a plurality of substrate processing devices which perform different processes on the substrates, and that then converges or merges again into the loop-shaped travel path.

Article transport vehicles commonly have an article grip portion which can be raised and lowered, or moved vertically. And the article grip portion is vertically moved when transferring an article to or from a carry-in-and-out portion of a substrate processing device with the article transport vehicle stopped at a location that corresponds to the carry-in-and-out portion of the substrate processing device.

An article transport facility of a ceiling installation type is disclosed in JP Publication Of Application No. 2002-37059 (Patent Document 1) in which a travel path is provided to include a two-directional (or two-pronged) diverging portion that has a straight forward path and a diverging path that diverges, or branches off, toward right or left. It is also possible to provide a travel path with a two-directional converging portion including a straight forward converging path and a converging path that converges or merges from right or left using, for example, the same configuration as in the two-directional diverging portion.

SUMMARY OF THE INVENTION

With an article transport facility of a ceiling installation type, there are constraints in the designing of the layout for the travel paths which the article transport vehicles are to travel along when diverging portions provided in the travel path are two-directional diverging portions, and converging portions provided in the travel paths are two-directional converging portions.

For example, if the diverging portions of the travel path are ones in which article transport vehicles are allowed to diverge, or branch off, toward both right and left, then there would be fewer constraints in the designing of the layout for the travel paths. Similarly, if converging portions of the travel path are ones in which article transport vehicles are allowed to converge from both right and left, then there would be fewer constraints in the designing of the layout for the travel paths. Thus, further improvement is desired in the transport facility of a ceiling installation type that was disclosed in Patent Document 1.

In other words, an article transport facility of a ceiling installation type is desired in which there are fewer constraints in the designing of the layout for the travel paths.

The first characteristic configuration of an article transport facility of a ceiling installation type of the present invention is that the facility comprises: an article transport vehicle including a travel portion, an article holding portion located under the travel portion, and right and left travel wheels at each of a front location and a back location of the travel portion;

guide rails provided along a travel path for the article transport vehicle, wherein the guide rails include a pair of right and left rail portions that are spaced apart from each other in a rail lateral direction, and wherein the pair of right and left rail portions have travel surfaces on which the travel wheels travel;

wherein the guide rails include: a three-directional diverging portion at which the travel path is diverged into three directions as the travel path extends from an upstream-side travel path toward a downstream-side travel path; a straight forward path; a left diverging path; and a right diverging path; with each of the straight forward path, the left diverging path, and the right diverging path diverging and extending from the three-directional diverging portion;

wherein the straight forward path is configured such that the pair of right and left rail portions provided along the straight forward path are discontinuous with and spaced apart from the pair of right and left rail portions provided along the upstream-side travel path of the three-directional diverging portion by a predetermined straight forward rail distance in a path longitudinal direction;

wherein the left diverging path is configured such that a left rail portion of the pair of right and left rail portions provided along the left diverging path is continuous with a left rail portion of the pair of right and left rail portions of the upstream-side travel path, wherein the right diverging path is configured such that a right rail portion of the pair of right and left rail portions provided along the right diverging path is continuous with a right rail portion of the pair of right and left rail portions of the upstream-side travel path, wherein the article transport vehicle includes a guided member for changing paths that is provided at a location above the travel wheels of the travel portion and a travel direction switching mechanism which switches a state in which the guided member is guided, wherein the article transport facility further comprises an upper guide rail that receives the guided member and an auxiliary receiving mechanism that receives and supports the article transport vehicle traveling in the three-directional diverging portion and between the pair of right and left rail portions of the upstream-side travel path and the pair of right and left rail portions of the straight forward path, wherein the upper guide rail is configured to have a left diverging guide surface for switching to a left diverging travel state in which the article transport vehicle is caused to diverge into and travel along the left diverging path, a right diverging guide surface for switching to a right diverging travel state in which the article transport vehicle is caused to diverge into and travel along the right diverging path, and a non-diverging guide surface for switching to a non-diverging travel state in which the article transport vehicle is caused to travel straight forward, wherein the travel direction switching mechanism is configured to switch the state in which the guided member is guided among a left diverging guide state in which the guided member is guided by the left diverging guide surface, a right diverging guide state in which the guided member is guided by the right diverging guide surface, and a non-diverging guide state in which the guided member is guided by the non-diverging guide surface, wherein the left diverging guide surface is configured to receive the guided member such as to limit the article transport vehicle in the left diverging travel state from leaning toward right, wherein the right diverging guide surface is configured to receive the guided member such as to limit the article transport vehicle in the right diverging travel state from leaning toward left, and wherein the auxiliary receiving mechanism is configured to receive and support the article transport vehicle traveling between the pair of right and left rail portions of the upstream-side travel path and the pair of right and left rail portions of the straight forward path in the non-diverging travel state.

The second characteristic configuration of an article transport facility of a ceiling installation type of the present invention is that the facility comprises: an article transport vehicle including a travel portion, an article holding portion located under the travel portion, and right and left travel wheels at each of a front location and a back location of the travel portion;

guide rails provided along a travel path for the article transport vehicle, wherein the guide rails include a pair of right and left rail portions that are spaced apart from each other in a rail lateral direction, and wherein the pair of right and left rail portions have travel surfaces on which the travel wheels travel;

wherein the guide rails include: a three-directional converging portion at which the travel path is converged from three directions as the travel path extends from an upstream-side travel path toward a downstream-side travel path; a straight forward converging path; a left converging path; and a right converging path; with each of the straight forward converging path, the left converging path, and the right converging path connected to the three-directional converging portion;

wherein the straight forward converging path is configured such that the pair of right and left rail portions provided along the straight forward converging path are discontinuous with and spaced apart from the pair of right and left rail portions provided along the downstream-side travel path of the three-directional converging portion by a predetermined straight forward rail distance in a path longitudinal direction;

wherein the left converging path is configured such that a left rail portion of the pair of right and left rail portions provided along the left converging path is continuous with a left rail portion of the pair of right and left rail portions of the downstream-side travel path, wherein the right converging path is configured such that a right rail portion of the pair of right and left rail portions provided along the right converging path is continuous with a right rail portion of the pair of right and left rail portions of the downstream-side travel path, wherein the article transport vehicle includes a guided member for converging travel that is provided at a location above the travel wheels of the travel portion and a converging state switching means which switches a state in which the guided member is guided, wherein the article transport facility further comprises a converging upper guide rail that receives the guided member and a converging travel auxiliary receiving mechanism that receives and supports the article transport vehicle traveling in the three-directional converging portion and between the pair of right and left rail portions of the straight forward converging path and the pair of right and left rail portions of the downstream-side travel path, wherein the converging upper guide rail is configured to have a left converging guide surface for causing the article transport vehicle to converge from the left converging path into the downstream-side travel path, a right converging guide surface for causing the article transport vehicle to converge from the right converging path into the downstream-side travel path, and a straight forward converging guide surface for causing the article transport vehicle to travel straight forward from the straight forward converging path into the downstream-side travel path, wherein the converging state switching mechanism is configured to switch among a left converging guide state in which the guided member is guided by the left converging guide surface, a right converging guide state in which the guided member is guided by the right converging guide surface, and a straight forward converging guide state in which the guided member is guided by the straight forward converging guide surface, wherein the left converging guide surface is configured to receive the guided member such as to limit the article transport vehicle, in the left converging travel state in which the article transport vehicle is caused to converge from the left converging path to the downstream-side travel path, from leaning toward right, wherein the right converging guide surface is configured to receive the guided member such as to limit the article transport vehicle, in the right converging travel state in which the article transport vehicle is caused to converge from the right converging path to the downstream-side travel path, from leaning toward left, wherein the converging travel auxiliary receiving mechanism is configured to receive and support the article transport vehicle traveling between the pair of right and left rail portions of the straight forward converging path and the pair of right and left rail portions of the downstream-side travel path in the straight forward converging travel state in which the article transport vehicle is caused to converge from the straight forward converging path into the downstream-side travel path.

With the first characteristic configuration described above, it is possible to cause the article transport vehicle to diverge and travel in the left diverging travel state and in the right diverging travel state in the three-directional diverging portion in addition to causing the article transport vehicle to travel straight forward in the non-diverging travel state. And, with the second characteristic configuration described above, it is possible to cause the article transport vehicle to travel in the straight forward converging travel state in which the article transport vehicle is caused to converge from the straight forward converging path into the downstream-side travel path, to cause the article transport vehicle to travel in the left converging travel state in which the article transport vehicle is caused to converge from the left converging path into the downstream-side travel path, and to cause the article transport vehicle to travel in the right converging travel state in which the article transport vehicle is caused to converge from the right converging path into the downstream-side travel path, in the three-directional converging portion.

In other words, when causing the article transport vehicle to travel in the three-directional diverging portion of the travel path, the article transport vehicle can be caused to diverge toward left, to diverge toward right, or to travel straight forward in the three-directional diverging portion by switching to the left diverging guide state, the right diverging guide state, or the non-diverging guide state, with the travel direction switching mechanism. In addition, the article transport vehicle can be caused to travel in the straight forward converging travel state, the left converging travel state, or the right converging travel state by switching to the straight forward converging guide state in which the guided member is guided by the straight forward converging guide surface when the article transport vehicle is traveling along the straight forward converging path, by switching to the left converging guide state in which the guided member is guided by the left converging guide surface when the article transport vehicle is traveling along the left converging path, or by switching to the right converging guide state in which the guided member is guided by the right converging guide surface when the article transport vehicle is traveling along the right converging path, respectively.

Incidentally, the travel portion of the article transport vehicle travels along the guide rails provided along the travel path. And since the guide rails include the pair of right and left rail portions that are spaced apart from each other in the rail lateral direction, the article transport vehicle can travel along the guide rails while utilizing the space between the pair of right and left rail portions as a space into which the upper portion of the article holding portion, or the support by means of which the article holding portion is suspended from and supported by the travel portion is inserted.

Therefore, it is necessary to secure a space into which the upper portion of the article holding portion, or the support by means of which the article holding portion is suspended from and supported by the travel portion is inserted, regardless of whether the article transport vehicle is to travel straight forward in the non-diverging travel state, or to diverge in the left diverging travel state, or in the right diverging travel state, in the three-directional diverging portion of the travel path. Similarly, it is necessary to secure a space into which the upper portion of the article holding portion, or the support by means of which the article holding portion is suspended from and supported by the travel portion is inserted, regardless of whether the article transport vehicle is to travel straight forward in the straight forward converging travel state, or converge in the left converging travel state, or in the right converging travel state, in the three-directional converging portion of the travel path.

With the first characteristic configuration, the space, that is formed between the pair of right and left rail portion of the straight forward path and the pair of right and left rail portion of the upstream-side travel path, functions as the space into which the upper portion of the article holding portion, or the support by means of which the article holding portion is suspended from and supported by the travel portion is inserted when the article transport vehicle traveling along the upstream-side travel path diverges into and travels along the left diverging path, and when the article transport vehicle traveling along the upstream-side travel path diverges into and travels along the right diverging path. Needless to say, the space formed between the pair of right and left rail portion of the straight forward path and an upstream-side travel path functions as the space into which the upper portion of the article holding portion, or the support by means of which the article holding portion is suspended from and supported by the travel portion is inserted when the article transport vehicle travels straight forward.

In addition, with the second characteristic configuration, the space, that is formed between the pair of right and left rail portion of the straight forward converging path and the pair of right and left rail portion of the downstream-side travel path, functions as the space into which the upper portion of the article holding portion, or the support by means of which the article holding portion is suspended from and supported by the travel portion is inserted when the article transport vehicle travels in the left converging travel state, and when the article transport vehicle travels in the right converging travel state. Needless to say, the space formed between the pair of right and left rail portion of the straight forward converging path and the downstream-side travel path functions as the space into which the upper portion of the article holding portion, or the support by means of which the article holding portion is suspended from and supported by the travel portion is inserted when the article transport vehicle travels in the straight forward converging state.

Thus, with the first characteristic configuration, the article transport vehicle can be maintained in the proper state although the right and left travel wheels of the travel portion of the article transport vehicle cannot be received and supported by the right and left rail portions of the guide rails in the three-directional diverging portion. Similarly, with the second characteristic configuration, the article transport vehicle can be maintained in the proper state although the right and left travel wheels of the travel portion of the article transport vehicle cannot be received and supported by the right and left rail portions of the guide rails in the three-directional converging portion.

For example, the article transport vehicle would lean toward right when the article transport vehicle traveling along the upstream-side travel path diverges into and travels along the left diverging path, because, although the left travel wheel of the right and left travel wheels of the travel portion remains on and in contact with the travel surface of the rail portion, the right travel wheel of the right and left travel wheels of the travel portion becomes afloat where the right travel wheel is not received or in contact with any rail portion. Similarly, the article transport vehicle would lean toward right when the article transport vehicle traveling along the left converging path travels in the left converging travel state, because, although the left travel wheel of the right and left travel wheels of the travel portion remains on and in contact with the travel surface of the rail portion, the right travel wheel of the right and left travel wheels of the travel portion becomes afloat where the wheel is not received or in contact with any rail portion.

To address this issue, with the first characteristic configuration, the left diverging guide surface is configured to receive the guided member such as to limit the article transport vehicle traveling in the left diverging travel state from leaning toward right. Thus, when the article transport vehicle traveling along the upstream-side travel path diverges into and travels along the left diverging path, the article transport vehicle can be limited from leaning toward right when the right travel wheel of the right and left travel wheels of the travel portion becomes afloat where the right travel wheel is not received or in contact with any rail portion, with the left travel wheel of the right and left travel wheels of the travel portion being placed on or in contact with the travel surface of the rail portion. Also, with the second characteristic configuration, the left converging guide surface is configured to receive the guided member such as to limit the article transport vehicle traveling in the left converging travel state from leaning toward right. Thus, when the article transport vehicle is traveling in the left converging travel state, the article transport vehicle can be limited from leaning toward right when the right travel wheel of the right and left travel wheels of the travel portion becomes afloat where the right travel wheel is not received or in contact with any rail portion, with the left travel wheel of the right and left travel wheels of the travel portion being placed on or in contact with the travel surface of the rail portion.

Similarly to the diverging travel to the left and converging travel from the left, the article transport vehicle would lean toward left when the article transport vehicle traveling along the upstream-side travel path diverges into and travels along the right diverging path, because, although the right travel wheel of the right and left travel wheels of the travel portion remains on and in contact with the travel surface of the rail portion, the left travel wheel of the right and left travel wheels of the travel portion becomes afloat where the left travel wheel is not received or in contact with any rail portion. Similarly, the article transport vehicle would lean toward left when the article transport vehicle traveling along the right converging path starts to travel in the right converging travel state because, although the right travel wheel of the right and left travel wheels of the travel portion remains on and in contact with the travel surface of the rail portion, the left travel wheel of the right and left travel wheels of the travel portion becomes afloat where the left travel wheel is not received or in contact with any rail portion.

To address this issue, with the first characteristic configuration, the right diverging guide surface is configured to receive the guided member such as to limit the article transport vehicle traveling in the right diverging travel state from leaning toward left. Thus, when the article transport vehicle traveling along the upstream-side travel path diverges into and travels along the right diverging path, the article transport vehicle can be limited from leaning toward left when the left travel wheel of the right and left travel wheels of the travel portion becomes afloat where the left travel wheel is not received or in contact with any rail portion, with the right travel wheel of the right and left travel wheels of the travel portion being placed on or in contact with the travel surface of the rail portion. Also, with the second characteristic configuration, the right converging guide surface is configured to receive the guided member such as to limit the article transport vehicle traveling in the right converging travel state from leaning toward left. Thus, when the article transport vehicle is traveling in the right converging travel state, the article transport vehicle can be limited from leaning toward left when the left travel wheel of the right and left travel wheels of the travel portion becomes afloat where the left travel wheel is not received or in contact with any rail portion, with the right travel wheel of the right and left travel wheels of the travel portion being placed on or in contact with the travel surface of the rail portion.

Incidentally, in the three-directional diverging portion, when the article transport vehicle traveling along the upstream-side travel path travels straight forward, the right and left travel wheels of the travel portion become afloat when they are no longer received and supported by the pair of right and left rail portions of the upstream-side travel path until they are received and supported by the pair of right and left rail portion of the straight forward path. Similarly, in the three-directional converging portion, when the article transport vehicle travels in the straight forward converging travel state, the right and left travel wheels of the travel portion become afloat when they are no longer received and supported by the pair of right and left rail portions of the straight forward converging path until they are received and supported by the pair of right and left rail portion of the downstream-side travel path.

To address this issue, because the auxiliary receiving mechanism is provided in the first characteristic configuration, the auxiliary receiving mechanism receives and supports the article transport vehicle even when the right and left travel wheels of the travel portion become no longer received and supported by the pair of right and left rail portion of the upstream-side travel path or by the pair of right and left rail portion of the straight forward path when the article transport vehicle traveling along the upstream-side travel path travels straight forward in non-diverging travel state. In addition, because the auxiliary receiving mechanism is provided in the second characteristic configuration, the article transport vehicle can be received and supported by the auxiliary receiving mechanism even when the right and left travel wheels of the travel portion are no longer received and supported by the pair of right and left rail portion of the straight forward converging path, or by the pair of right and left rail portion of the downstream-side travel path when the article transport vehicle travels in the straight forward converging travel state.

As described above, with the first characteristic configuration, the layout for the travel path can be designed with fewer constraints because the article transport vehicle can be caused to diverge toward left or right in the three-directional diverging portion in addition to causing it to travel straight forward. And, with the second characteristic configuration described above, it is possible to cause the article transport vehicle to travel in the straight forward converging travel state in which the article transport vehicle is caused to converge from the straight forward converging path into the downstream-side travel path, to cause the article transport vehicle to travel in the left converging travel state in which the article transport vehicle is caused to converge from the left converging path into the downstream-side travel path, and to cause the article transport vehicle to travel in the right converging travel state in which the article transport vehicle is caused to converge from the right converging path into the downstream-side travel path, in the three-directional converging portion.

Thus, with the first and second configurations, an article transport facility of a ceiling installation type can be provided in which the layout for the travel path can be designed with fewer constraints.

In one mode of configuration, the article transport vehicle preferably further includes an auxiliary wheel at a location above the travel portion, wherein the auxiliary wheel is preferably configured to be switched between a received position in which the auxiliary wheel is received and supported by an auxiliary guide rail provided at a location above the three-directional diverging portion and a retracted position in which the auxiliary wheel is not received by the auxiliary guide rail, and wherein the auxiliary receiving mechanism is preferably configured to suspend and support the article transport vehicle with the auxiliary guide rail by receiving the auxiliary wheel with the auxiliary guide rail. In addition, the article transport vehicle preferably further includes an auxiliary wheel at a location above the travel portion, wherein the auxiliary wheel is preferably configured to be switched between a received position in which the auxiliary wheel is received and supported by an auxiliary guide rail provided at a location above the three-directional converging portion and a retracted position in which the auxiliary wheel is not received by the auxiliary guide rail, and wherein the converging travel auxiliary receiving mechanism is preferably configured to suspend and support the article transport vehicle with the auxiliary guide rail by receiving the auxiliary wheel with the auxiliary guide rail.

More specifically, when the article transport vehicle traveling along the upstream-side travel path portion is caused to travel straight forward, the article transport vehicle can be suspended from and supported by the auxiliary guide rail by switching the auxiliary wheel provided at a location above the travel portion to the received position to receive and support the auxiliary wheel with the auxiliary guide rail even when the right and left travel wheels of the travel portion become no longer received and supported by the pair of right and left rail portions of the upstream-side travel path or by the pair of right and left rail portion of the straight forward path. On the other hand, when the article transport vehicle traveling along the upstream-side travel path is caused to diverge toward left or right, the article transport vehicle can be caused to diverge toward right or left without the auxiliary guide rail and the auxiliary wheel interfering with each other by switching the auxiliary wheel provided at the location above the travel portion to the retracted position so that the auxiliary wheel is not received or supported by the auxiliary guide rail.

In addition, when the article transport vehicle traveling along the straight forward converging travel path portion is caused to travel in the straight forward converging travel state, the article transport vehicle can be suspended from and supported by the auxiliary guide rail by switching the auxiliary wheel provided at a location above the travel portion to the received position to receive and support the auxiliary wheel with the auxiliary guide rail even when the right and left travel wheels of the travel portion become no longer received and supported by the pair of right and left rail portions of the straight forward converging travel path or by the pair of right and left rail portion of the downstream-side travel path. On the other hand, when the article transport vehicle is caused to travel in the left converging travel state or right converging travel state, the article transport vehicle can be caused to travel in the left converging travel state or right converging travel state without the auxiliary guide rail and the auxiliary wheel interfering with each other, by switching the auxiliary wheel provided at the location above the travel portion to the retracted position so that the auxiliary wheel is not received or supported by the auxiliary guide rail.

And the auxiliary receiving mechanism is configured to be the means by which the article transport vehicle is suspended and supported by the auxiliary guide rail by receiving the auxiliary wheel with the auxiliary guide rail, thus facilitating the simplification of the entire configuration of the facility.

For example, it is conceivable to have a configuration for the auxiliary receiving mechanism in which movable rails for receiving the right and left travel wheels of the travel portion are provided as means for receiving and supporting the right and left travel wheels such that the movable rails can be switched between a receiving position and a retracted position. However, with this configuration, when a plurality of three-directional diverging portions and three-directional converging portions are provided in the travel path, movable rails and an actuator for switching the movable rails between the receiving position and the retracted position need to be provided at each of the three-directional diverging portions and three-directional converging portions, which leads to a possibility that the entire configuration of the facility may become complicated.

On the other hand, by having a configuration in which an auxiliary guide rail is fixedly installed to each three-directional diverging portion in the travel path and in which an auxiliary wheel, that can be switched between the received position and the retracted position, is provided to the article transport vehicle, all one needs to do is to fixedly install an auxiliary guide rail at each three-directional diverging portion even when a plurality of three-directional diverging portions are provided in the travel path, which facilitates the simplification of the entire configuration of the facility. Similarly, by having a configuration in which an auxiliary guide rail is fixedly installed to each three-directional converging portion in the travel path and in which an auxiliary wheel, that can be switched between the received position and the retracted position, is provided to the article transport vehicle, all one needs to do is to fixedly install an auxiliary guide rail at each three-directional converging portion even when a plurality of three-directional converging portions are provided in the travel path, which facilitates the simplification of the entire configuration of the facility.

As a result, an article transport facility of a ceiling installation type can be provided which facilitates the simplification of the entire configuration of the facility.

In one mode of configuration, the non-diverging guide surface is preferably configured to define an upwardly sloped surface in a cross-sectional view taken at a plane that is perpendicular to a direction in which the upper guide rail extends, wherein the guided member preferably includes a wheel body that is rotatable about a pivot axis extending parallel to the non-diverging guide surface in the cross-sectional view, and wherein the upper guide rail is preferably configured to function as the auxiliary guide rail and the guided member is configured to function as the auxiliary wheel. Similarly, the straight forward converging guide surface is preferably configured to define an upwardly sloped surface in a cross-sectional view taken at a plane that is perpendicular to a direction in which the converging upper guide rail extends, wherein the guided member preferably includes a wheel body that is rotatable about a pivot axis extending parallel to the straight forward converging guide surface in the cross-sectional view, and wherein the converging upper guide rail is preferably configured to function as the auxiliary guide rail and the guided member is configured to function as the auxiliary wheel.

Because the upper guide rail and the guided member, that are provided to switch the travel direction of an article transport vehicle or to cause the article transport vehicle to converge, are used as components of the auxiliary receiving mechanism, the auxiliary receiving mechanism can be configured while facilitating the simplification of the configuration of the article transport vehicle.

As a result, an article transport facility of a ceiling installation type can be provided which has an additional advantage that the auxiliary receiving mechanism can be configured while facilitating the simplification of the configuration of the article transport vehicle.

In addition, in one mode of configuration, the guided member that functions as the auxiliary wheel is preferably configured to be switched between the received position and the retracted position through movements along an extending direction of the pivot axis that is parallel to the non-diverging guide surface. Similarly, in one mode of configuration, the guided member that functions as the auxiliary wheel is preferably configured to be switched between the received position and the retracted position through movements along an extending direction of the pivot axis that is parallel to the straight forward converging guide surface.

That is, the guided member can be switched between the received position and the retracted position by moving the guided member which functions as the auxiliary wheel along a direction of the pivot axis that is parallel to the non-diverging guide surface or the straight forward converging guide surface.

Therefore, for example, the guided member can be switched between the received position and the retracted position for a maintenance purpose with the article transport vehicle stopped in the three-directional diverging portion or in the three-directional converging portion; thus, the guided member can be conveniently switched between the received position and the retracted position. Incidentally, needless to say, it is necessary to receive and support the article transport vehicle by other means when switching the guided member between the received position and the retracted position with the article transport vehicle stopped in the three-directional diverging portion or in the three-directional converging portion.

With such configuration, an article transport facility of a ceiling installation type can be provided which has an additional advantage that the guided member can be conveniently switched between the received position and the retracted position.

In one mode of configuration, the straight forward rail distance is preferably defined to be smaller than a fore and aft wheel distance which is a distance in the fore and aft direction between the travel wheels provided to the travel portion of the article transport vehicle. Thus, the auxiliary receiving mechanism can have a convenient and reliable configuration with a simple structure.

DETAILED DESCRIPTION

[First Embodiment]

Figure 2:
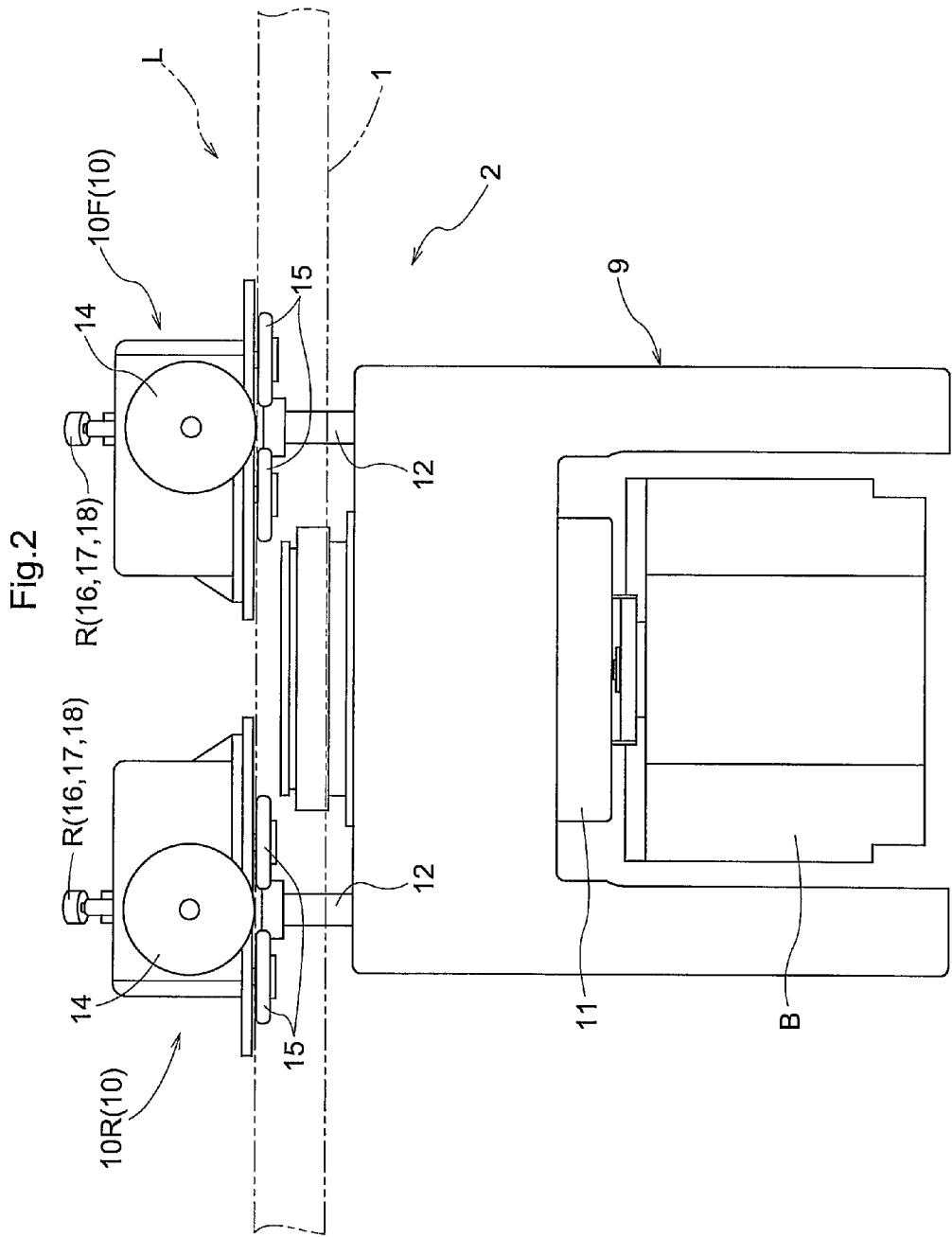
FIG. 2 is a side view of an article transport vehicle.
Figure 3:
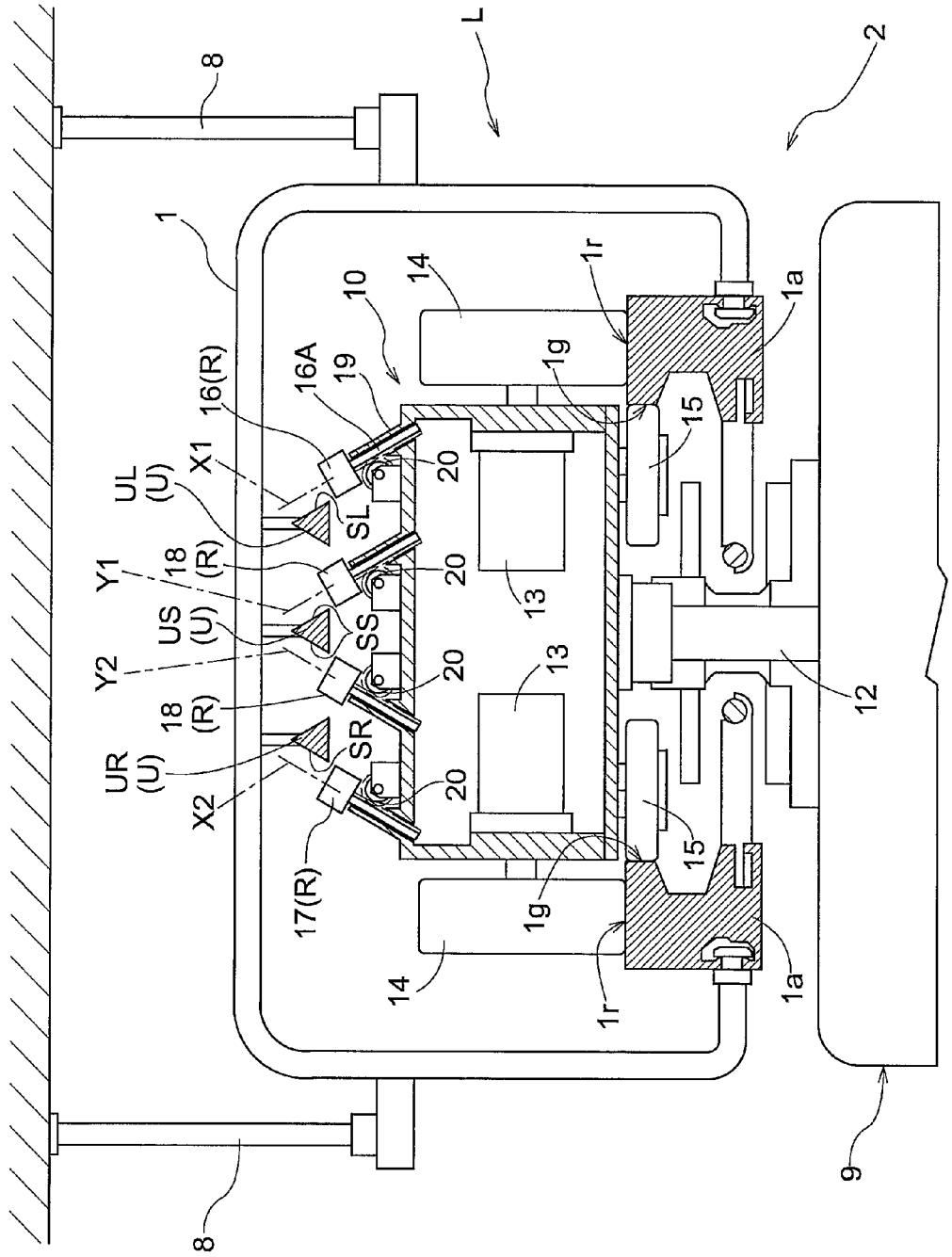
FIG. 3 is a front view of the article transport vehicle.

The first embodiment of an article transport facility of the ceiling installation type of the present invention is described next with reference to the drawing. As shown in FIGS. 2 and 3, a travel guide portion L including guide rails 1 is provided on the ceiling side of a clean room. And a plurality of article transport vehicles 2 that travel along the travel guide portion L are provided. In the present embodiment, each article transport vehicle 2 is configured to transport, as an article B, a container for housing and carrying semiconductor substrates.

Figure 1:
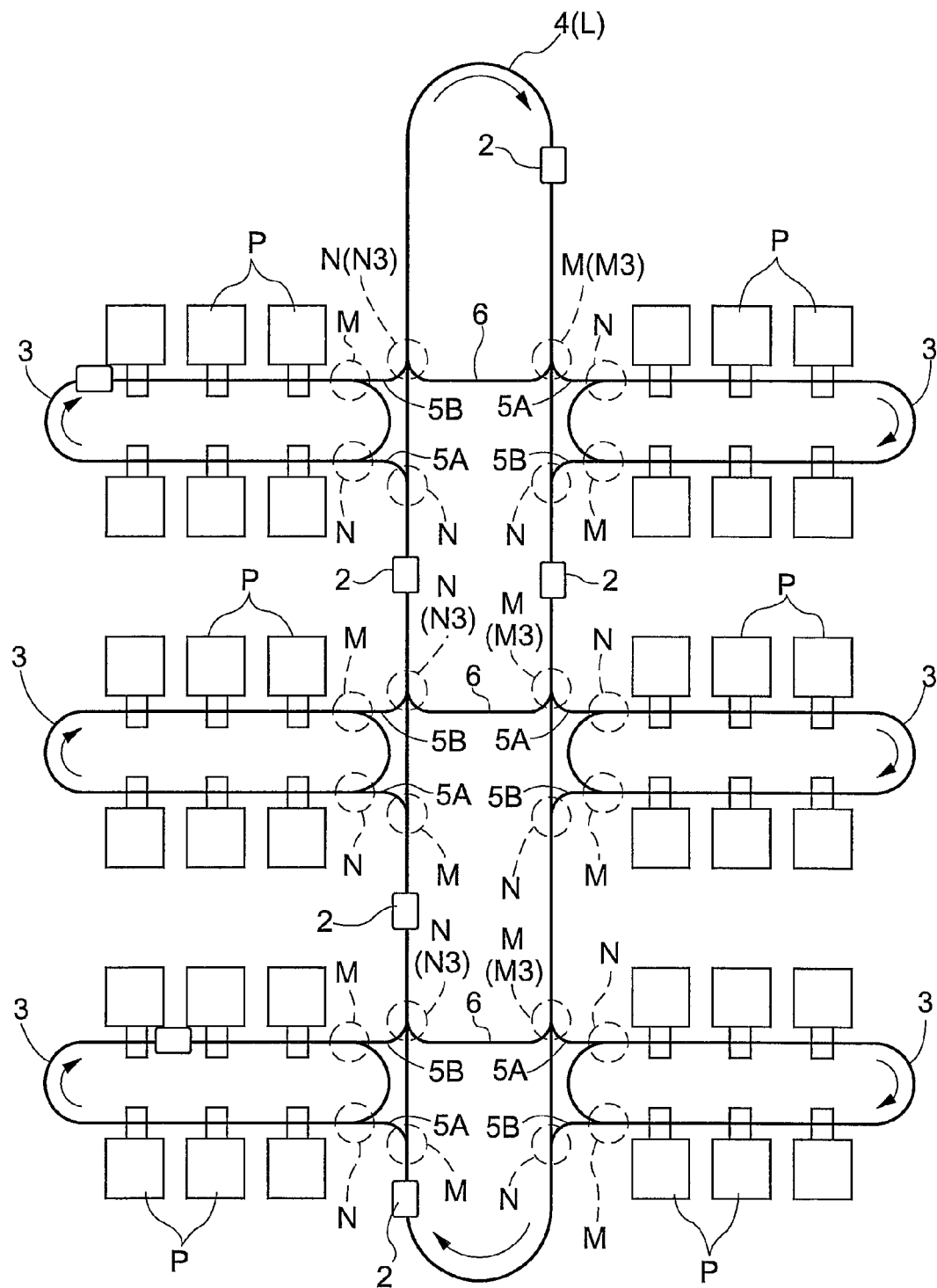
FIG. 1 is a diagramic plan view of an article transport facility of a ceiling installation type.

As shown in FIG. 1, the travel guide portion L is provided such as to define or form a plurality of loop-shaped secondary travel paths 3 each of which extends by way of, or along, a plurality of article processors P and a loop-shaped travel path 4. And the travel guide portion L further defines or forms diverging connecting paths 5A each of which allows article transport vehicles 2 traveling along the travel path 4 to diverge, or branch off, into a secondary travel path 3, converging connecting paths 5B each of which allows article transport vehicles 2 traveling along a secondary travel path 3 to converge, or merge, into the travel path 4, and shortcut paths 6 each of which connects a pair of right and left straight paths (which are parts of a path) to each other in the loop-shaped travel path 4. Incidentally, in the present embodiment, each of the loop-shaped secondary travel paths 3 as well as the loop-shaped travel path 4 is formed to have an elongated circle or loop (i.e. shape of a track of an athletic field) in which a pair of right and left straight paths are connected by arc-shaped or curved paths.

While traveling in one direction, the article transport vehicles 2 are configured to travel along the travel path 4 or along a secondary travel path 3, to diverge from the travel path 4 into a secondary travel path 3, to converge or merge from a secondary travel path 3 into the travel path 4, and/or to take a shortcut through a shortcut path 6. Note that in FIG. 1, the travel directions of the article transport vehicles 2 are indicated by the arrows.

That is, in the present embodiment, each article transport vehicle 2 travels in one direction as described above to perform a transport operation of an article B received from an article processor P to another article processor P that performs another process. While not shown, a plurality of storage portions for temporarily storing articles B are provided at some locations along the secondary travel paths 3 or along the travel path 4. Therefore, each article transport vehicle 2 also performs a transport operation to transport an article B received from an article processor P to a storage portion as well as a transport operation to transport an article B received from a storage portion to an article processor P.

In FIG. 1, the diverging portions M include locations at which a diverging connecting path 5A is connected to the travel path 4 and at locations at which a converging connecting path 5B is connected to the corresponding secondary travel path 3. The converging portions N include locations at which a diverging connecting path 5A is connected to the corresponding secondary travel path 3, and locations at which a converging connecting path 5B is connected to the travel path 4.

And, in the present embodiment, the shortcut paths 6 are provided such that each shortcut path 6 connects one of the diverging portions M at which a diverging connecting path 5A is connected to the travel path 4, with one of the converging portions N at which a converging connecting path 5B is connected to the travel path 4. Therefore, among the diverging portions M, the diverging portions M from which a shortcut path 6 branches off, or breaks off, define the three-directional diverging portions M3. And among the converging portions N, the converging portions N into which a shortcut path 6 converges or merges define the three-directional converging portions N3.

Figure 4:
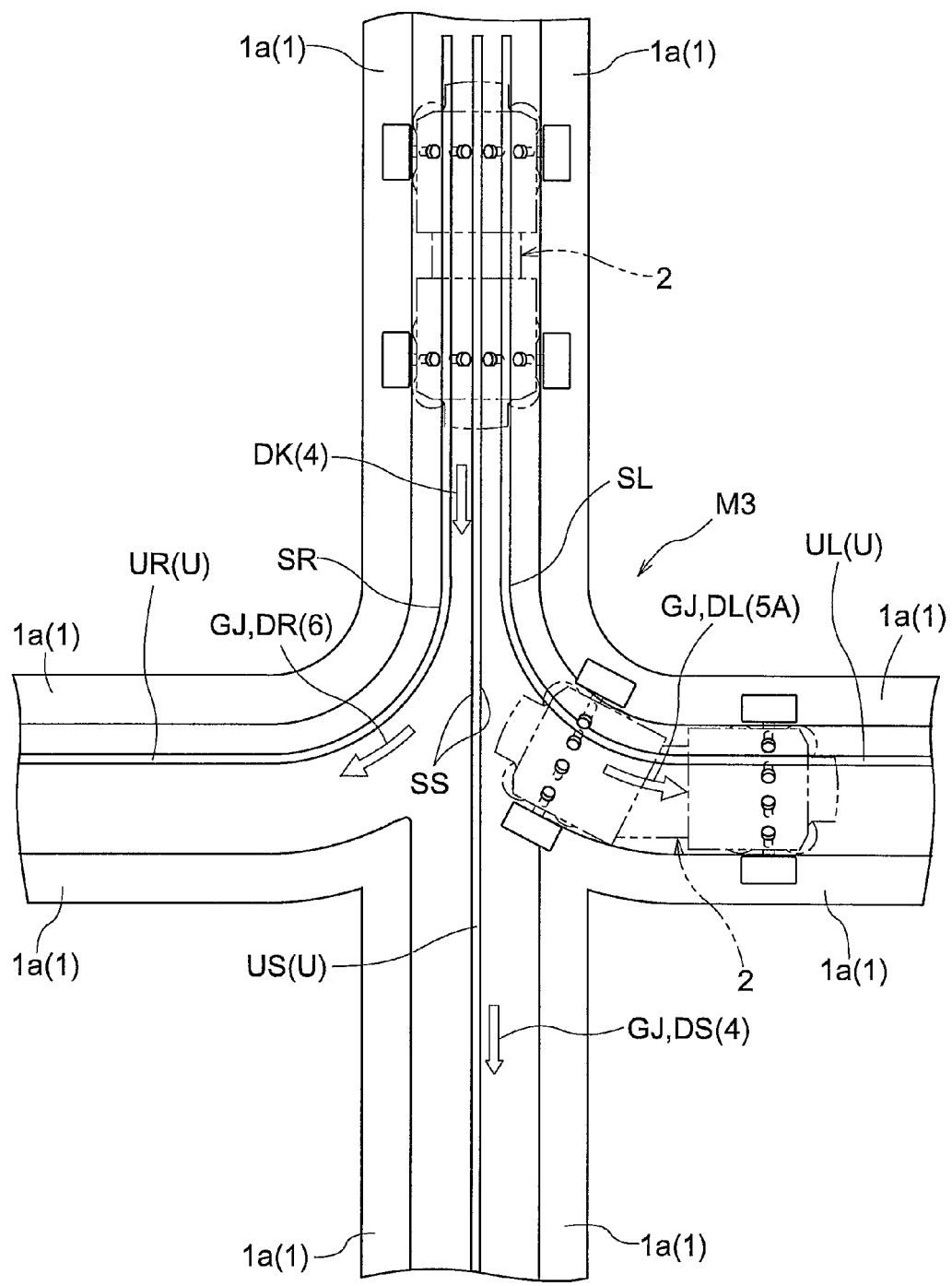
FIG. 4 is a plan view of a three-directional diverging portion of the first embodiment.

As shown in FIG. 4, a straight forward path DS, a left diverging path DL, and a right diverging path DR are included in, and extend from, each three-directional diverging portion M3. And the straight forward path DS corresponds to the travel path 4 while the left diverging path DL corresponds to the diverging connecting path 5A whereas the right diverging path DR corresponds to the shortcut path 6 in the present embodiment.

Figure 7:
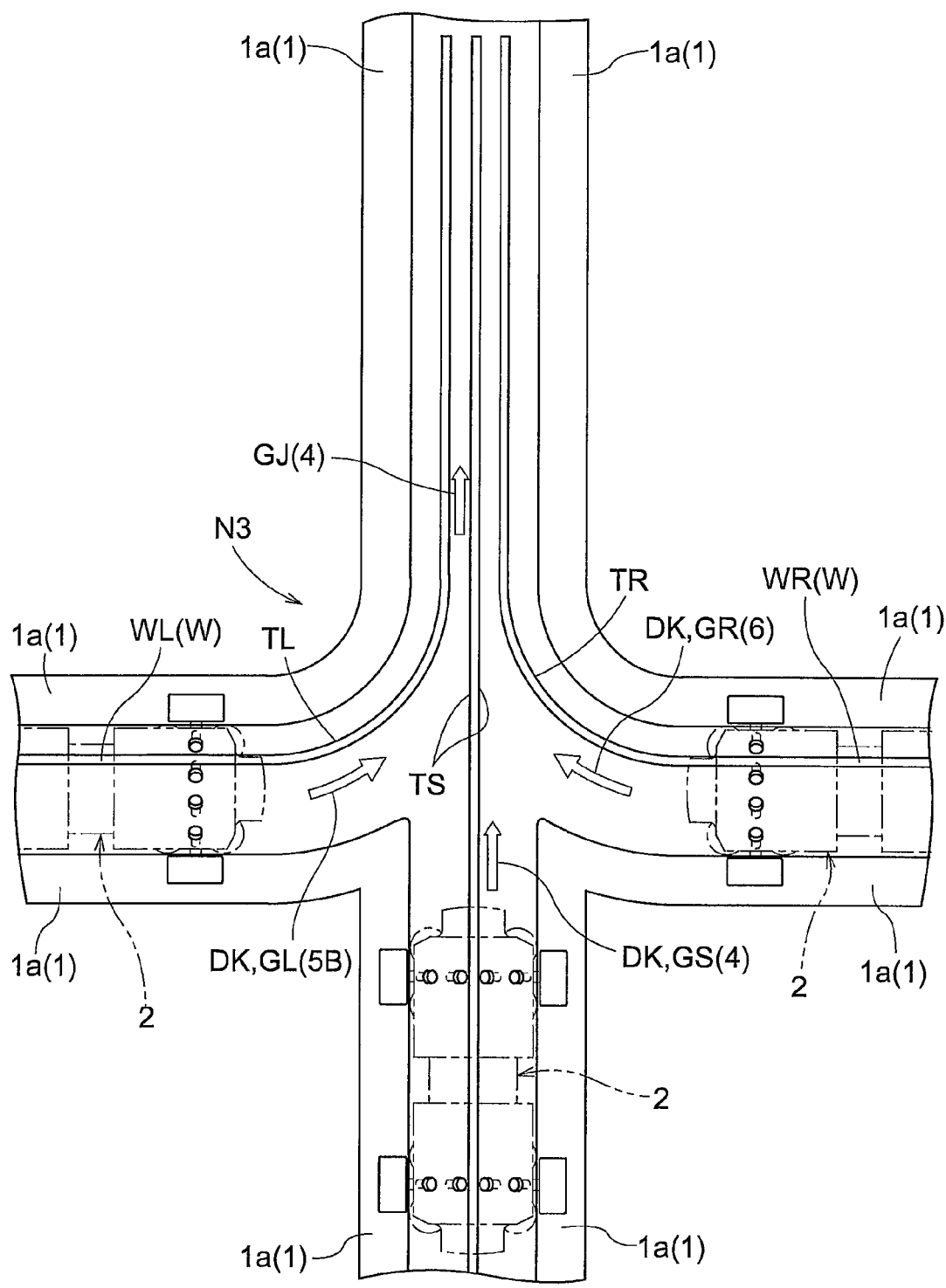
FIG. 7 is a plan view of a three-directional converging portion of the first embodiment.

As shown in FIG. 7, a straight forward converging path GS, a left converging path GL, and a right converging path GR are included in and connected to each three-directional converging portion N3. And the straight forward converging path GS corresponds to the travel path 4 while the left converging path GL corresponds to the converging connecting path 5B whereas the right converging path GR corresponds to the shortcut path 6 in the present embodiment.

Next, the configuration of each part is described further. The guide rails 1 of the travel guide portion L are arranged such that they extend along the travel path 4 and along each secondary travel path 3. And the guide rails 1 are also configured to be suspended from the ceiling portion by means of the travel rail supports 8 as shown in FIG. 3, and include a pair of right and left rail portions 1a that are spaced apart from each other in a rail lateral direction as shown in FIGS. 3 and 4.

In the following description, the lateral direction of the article transport vehicle 2 is referred to as the vehicle body lateral direction for short: the fore and aft direction of the article transport vehicle 2 is referred to as the vehicle body fore and aft direction for short: and the vertical direction of the article transport vehicle 2 is referred to as the vehicle body vertical direction for short.

As shown in FIGS. 2 and 3, each article transport vehicle 2 includes a vehicle main body 9 located under the travel guide portion L and a travel portion 10 which is configured to travel along the travel guide portion L. And the vehicle main body 9 is provided with a grip portion 11 for gripping an article B with the article B being suspended from the grip portion 11. The travel portion 10 includes a front travel portion 10F and a back travel portion 10R with one located behind the other. And a connecting shaft 12, which extends downwardly from each of the front travel portion 10F and the back travel portion 10R along the vertical direction, is provided to each of the front travel portion 10F and the back travel portion 10R, and extends downwardly between the pair of right and left rail portions 1a. And the vehicle main body 9 is suspended from and supported by each of the front travel portion 10F and the back travel portion 10R by means of the connecting shafts 12 such that the vehicle main body 9 can be rotated, or is rotatable, with respect to each of the front travel portion 10F and the back travel portion 10R.

As shown in FIG. 3, right and left travel wheels 14 that are driven and rotated by electric-powered drive motors 13 are provided to each of the front travel portion 10F and the back travel portion 10R such that the right and left travel wheels 14 travel on travel surfaces 1r defined by the top surfaces of the pair of right and left rail portions 1a. In addition, right and left guide wheels 15 which can be rotated freely about axes extending along the vehicle body vertical direction (i.e., about vertical axes) are provided such that right and left guide wheels 15 are in contact with guide surfaces 1g defined by inward side faces of the pair of right and left rail portions 1a. Note that two sets of the right and left guide wheels 15 are provided to each of the front travel portion 10F and the back travel portion 10R with one set located behind the other.

Therefore, the article transport vehicle 2 is configured to travel along the guide rails 1 by virtue of the fact that the travel wheels 14 of the front travel portion 10F and the back travel portion 10R are driven and rotated while its position in the vehicle body lateral direction is restricted by virtue of the fact that the guide wheels 15 of the front travel portion 10F and the back travel portion 10R are guided by the pair of rail portions 1a. In addition, the article transport vehicle 2 is configured to travel smoothly even in an arc-shaped or curved path, such as an arc-shaped or curved path of the travel path 4 and an arc-shaped or curved path of a secondary travel path 3 by virtue of the fact that the front travel portion 10F and the back travel portion 10R are deflected with respect to the vehicle main body 9 about the axes of the connecting shafts 12 (i.e. about the axes extending along the vehicle body vertical direction).

While the vehicle main body 9 includes the grip portion 11 described above such that the grip portion 11 can be raised or lowered, or moved vertically, and can be turned or rotated, such configuration is known and thus is not described further in the present embodiment. Each article transport vehicle 2 has a carriage side controller (not shown) for controlling the operations of the article transport vehicle 2 by controlling traveling operations of the front travel portion 10F and the back travel portion 10R, and vertical movement and turning operations of the grip portion 11, etc. And the carriage side controller is configured to perform a transport process in which an article B is transported from a station of transport origin to a station of transport destination specified in a transport command when the carriage side controller receives, by means of wireless communications etc., the transport command which specifies the station of transport origin and the station of transport destination from the facility management computer which manages operations of the plurality of article transport vehicles 2.

While not shown, a pair of right and left electricity supply lines for supplying driving electric power to the article transport vehicle 2 are provided to the travel guide portion L such that they extend along the travel path 4 and along each secondary travel path 3, similarly to the pair of right and left rail portions 1a. And a power receiving portion (power receiving coil), by means of which driving electric power is supplied from the right and left electricity supply lines without contact or contactlessly, is provided to the vehicle main body 9 of the article transport vehicle 2 such that the position of the power receiving portion corresponds to the locations of the pair of right and left electricity supply lines. And magnetic field is generated by applying alternating currents to the electricity supply lines. The magnetic field, in turn, causes the power receiving portion to generate driving electric power. Thus, the driving electric power is supplied to the article transport vehicle 2 without contact.

The configuration for causing the article transport vehicles 2 to diverge at a diverging portion M, and to converge or merge at a converging portion N is described next. Since the diverging portion M that diverges, or splits, into two directions uses a part of the configuration of the three-directional diverging portion M3 that causes the article transport vehicles 2 to diverge and since the converging portion N that is converged, or merged, from two directions uses a part of the configuration of the three-directional converging portion M3 that causes the article transport vehicles 2 to converge, the configuration for causing the article transport vehicles 2 to diverge in the three-directional diverging portion M3 and the configuration for causing the article transport vehicles 2 to converge in the three-directional diverging portion M3 are described first.

As shown in FIG. 4, in the three-directional diverging portion M3, the pair of right and left rail portions 1a that are provided along the straight forward path DS that extends from the three-directional diverging portion M3 are provided so as to be spaced apart, in a path longitudinal direction (straight forward extending direction of the travel path), from the pair of right and left rail portions 1a that are provided along the upstream-side travel path DK of the three-directional diverging portion M3 of the travel path 4. Incidentally, the distance (straight forward rail distance) between the pair of right and left rail portions 1a that are provided along the straight forward path DS and the pair of right and left rail portions 1a that are provided along the upstream-side travel path DK is smaller than the distance (wheel base or fore and aft wheel distance) between the travel wheels 14 of the front travel portion 10F and the travel wheels 14 of the back travel portion 10R.

In addition, the left rail portion 1a of the pair of right and left rail portions 1a that are provided along the left diverging path DL which extends from the three-directional diverging portion M3 is configured to be continuous with the left rail portion 1a of the pair of right and left rail portions 1a of the upstream-side travel path DK. Incidentally, in the present embodiment, the right rail portion 1a of the pair of right and left rail portions 1a that are provided along the left diverging path DL which extends from the three-directional diverging portion M3 is configured to be continuous with the left rail portion 1a of the pair of right and left rail portions 1a that are provided along the straight forward path DS; however, the embodiment may be such that these rail portions are not continuous with each other.

In addition, the right rail portion 1a of the pair of right and left rail portions 1a that are provided along the right diverging path DR which extends from the three-directional diverging portion M3 is configured to be continuous with the right rail portion 1a of the pair of right and left rail portions 1a of the upstream-side travel path DK. Incidentally, in the present embodiment, the left rail portion 1a of the pair of right and left rail portions 1a that are provided along the right diverging path DR which extends from the three-directional diverging portion M3 is configured to be continuous with the right rail portion 1a of the pair of right and left rail portions 1a that are provided along the straight forward path DS; however, the embodiment may be such that these rail portions are not continuous with each other.

As shown in FIG. 7, in the three-directional converging portion N3, the pair of right and left rail portions 1a that are provided along the straight forward converging path GS that is connected to the three-directional converging portion N3 are provided so as to be spaced apart, in a path longitudinal direction, from the pair of right and left rail portions 1a that are provided along the downstream-side travel path GJ of the three-directional converging portion N3 of the travel path 4.

In addition, the left rail portion 1a of the pair of right and left rail portions 1a that are provided along the left converging path GL which is connected to the three-directional converging portion N3 is configured to be continuous with the left rail portion 1a of the pair of right and left rail portions 1a of the downstream-side travel path GJ. Incidentally, in the present embodiment, the right rail portion 1a of the pair of right and left rail portions 1a that are provided along the left converging path GL which is connected to the three-directional converging portion N3 is configured to be continuous with the left rail portion 1a of the pair of right and left rail portions 1a that are provided along the straight forward converging path GS; however, the embodiment may be such that these rail portions are not continuous with each other.

In addition, the right rail portion 1a of the pair of right and left rail portions 1a that are provided along the right converging path GR which is connected to the three-directional converging portion N3 is configured to be continuous with the right rail portion 1a of the pair of right and left rail portions 1a of the downstream-side travel path GJ. Incidentally, in the present embodiment, the left rail portion 1a of the pair of right and left rail portions 1a that are provided along the right converging path DR which is connected to the three-directional converging portion N3 is configured to be continuous with the right rail portion 1a of the pair of right and left rail portions 1a that are provided along the straight forward converging path GS; however, the embodiment may be such that these rail portions are not continuous with each other.

As shown in FIGS. 2 and 3, provided at locations above the travel wheels 14 in each of the front travel portion 10F and the back travel portion 10R are wheel bodies R which function as guided members for switching paths in the diverging portion M and which also function as guided members for converging travel in the converging portion N.

More specifically, arranged in a row in the vehicle body lateral direction as wheel bodies R in each travel portion 10F, 10R are a first wheel body 16 which functions as a wheel body for diverging travel to the left in the three-directional diverging portion M3 and which functions as a wheel body for converging travel to the left in the three-directional converging portion N3, a second wheel body 17 which functions as a wheel body for diverging travel to the right in the three-directional diverging portion M3 and which functions as a wheel body for converging travel to the right in the three-directional converging portion N3, and a pair of right and left third wheel bodies 18 which function as wheel bodies for straight-forward travel in the three-directional diverging portion M3 and which function as wheel bodies for straight-forward converging travel in the three-directional converging portion N3.

That is, the first wheel body 16, the second wheel body 17, and the third wheel bodies 18 are arranged in a row in the vehicle body lateral direction such that the first wheel body 16 is located in the left side in the vehicle body lateral direction and the second wheel body 17 is located in the right side in the vehicle body lateral direction, and such that the third wheel bodies 18 are located between the first wheel body 16 and the second wheel body 17.

And the first wheel body 16 can be rotated (i.e., rotatable) about the first pivot axis X1 which is tilted inwardly of the vehicle body (i.e. tilted such that its higher portion is located further inwardly of the vehicle body) and can also be moved vertically, or raised and lowered, along the first pivot axis X1. Similarly, the second wheel body 17 can be rotated (i.e., rotatable) about a second pivot axis X2 which is tilted inwardly of the vehicle body (i.e. tilted such that its higher portion is located further inwardly of the vehicle body) and can also be moved vertically, or raised and lowered, along the second pivot axis X2.

In addition, of the pair of third wheel bodies 18, the left third wheel body 18 can be rotated about a right-tilted pivot axis Y1 which is tilted toward right (i.e. tilted such that its higher portion is located further to the right) and can also be moved vertically, or raised and lowered, along the right-tilted pivot axis Y1. And, of the pair of third wheel bodies 18, the right third wheel body 18 can be rotated about a left-tilted pivot axis Y2 which is tilted toward left (i.e. tilted such that its higher portion is located further to the left) and can also be moved vertically, or raised and lowered, along the left-tilted pivot axis Y2.

The structure for supporting the first wheel body 16 such that the first wheel body 16 can be moved vertically along the first pivot axis X1 is one in which a support shaft 16A of the first wheel body 16 is inserted into a tubular member 19 provided to the travel portion 10 such that the support shaft 16A can be moved vertically and in which a pinion gear 20 which engages a rack formed in and along the support shaft 16A is actuated in a forward direction and its opposite direction by an electric motor (not shown). And, while no further detail is provided here, the second wheel body 17 and the third wheel bodies 18 are configured to be moved vertically by an identical structure. In other words, the second wheel body 17 and each of the third wheel bodies 18 are also configured such that the respective pinion gear for vertical movement is actuated in a forward direction and its opposite direction by an electric motor (not shown).

As shown in FIGS. 3 and 4, upper guide rails U for receiving the wheel bodies R are provided in the three-directional diverging portion M3 such that the upper guide rails U are supported by the ceiling portion. In the present embodiment, the upper guide rails U include a rail UL for diverging to the left (or left diverging rail), a rail UR for diverging to the right (or right diverging rail), and a rail US for straight forward travel (or straight forward rail). In other words, the left diverging rail UL is located in the left hand side of the travel path 4: the right diverging rail UR is located in the right hand side of the travel path 4: and, the straight forward rail US is located between the left diverging rail UL and the right diverging rail UR.

Note that although the rails which receive the wheel bodies R in the three-directional diverging portion M3 are described above as the upper guide rails U, the upper rails including ones which receive the wheel bodies R in the three-directional converging portion N3 (the upper rails W for converging travel), as described below, may also be referred to as "upper guide rails". More specifically, the upper guide rails with the reference symbol "U" are the "upper rails for diverging travel", and the upper guide rails with the reference symbol "W" are the "upper rails for converging travel" with both types of guide rails may be collectively referred to as the "upper guide rails". In addition, although the upper guide rail U that extends straight forward in the three-directional diverging portion M3 is referred to as the straight forward rail US, a guide rail (rail WS for straight forward converging travel) which extends straight forward to converge into the three-directional converging portion N3 as described below may also be referred to as a "straight forward rail". More specifically, the upper guide rail with the reference symbol "US" may be referred to as a "straight forward diverging rail", and the upper guide rail with the reference symbol "WS" as described below is a "straight forward converging rail", with both types of guide rails collectively referred to as "straight forward rails".

The left diverging rail UL is configured to extend from the upstream-side travel path portion DK in a curve along the left diverging path DL, as seen in plan view. The right diverging rail UR is configured to extend from the upstream-side travel path portion DK in a curve along the right diverging path DR, as seen in plan view. The straight forward rail US is configured to extend straight forward along the straight forward path DS from the upstream-side travel path DK, as seen in plan view. In addition, as shown in FIG. 3, each of the straight forward rail US, the left diverging rail UL, and the right diverging rail UR is formed such that the cross-sectional shape taken at a plain that is perpendicular to the direction in which each rail extends is an isosceles triangle or similar, or close thereto. Therefore, each side face of the straight forward rail US, of the left diverging rail UL, and of the right diverging rail UR is an upwardly sloped surface in the cross-sectional view taken at a plain that is perpendicular to the direction in which each rail extends (or as seen in the longitudinal direction of the upper guide rails U).

Further, the right-tilted pivot axis Y1 and the left-tilted pivot axis Y2 of the left and right third wheel bodies 18 are configured to extend parallel to the left and right side faces of the straight forward rail US in the cross-sectional view taken at a plain that is perpendicular to the direction in which each rail extends (or as seen in the longitudinal direction of the upper guide rails U). Similarly, the first pivot axis X1 of the first wheel body 16 is configured to extend parallel to a side face of the left diverging rail UL. And the second pivot axis X2 of the second wheel body 17 is configured to extend parallel to a side face of the right diverging rail UR.

And the left side face of the left diverging rail UL is configured to define a left diverging guide surface SL for switching to a left diverging travel state in which the article transport vehicle 2 is caused to diverge along the left diverging path DL. Also, the right side face of the right diverging rail UR is configured to define a right diverging guide surface SR for switching to a right diverging travel state in which the article transport vehicle 2 is caused to diverge along the right diverging path DR. In addition, the right and left side faces of the straight forward rail US is configured to define non-diverging guide surfaces SS for switching to a non-diverging travel state in which the article transport vehicle 2 is caused to travel straight forward.

Thus, the first wheel body 16 in each of the front travel portion 10F and the back travel portion 10R is configured to be vertically moved by the pinion gear 20 which is actuated in the forward direction and the opposite direction by the electric motor to be switched between a received position at which the first wheel body 16 is received by the left diverging guide surface SL of the left diverging rail UL and a retracted position at which the first wheel body 16 is not received by the left diverging guide surface SL. Similarly, the second wheel body 17 is configured to be vertically moved by the pinion gear 20 which is actuated in the forward direction and the opposite direction by the electric motor to be switched between a received position at which the second wheel body 17 is received by the right diverging guide surface SR of the right diverging rail UR and a retracted position at which the second wheel body 17 is not received by the right diverging guide surface SR.

In addition, the pair of right and left third wheel bodies 18 are configured to be vertically moved by the pinion gears 20 each of which is actuated in the forward direction and the opposite direction by an electric motor to be switched between a received position at which the third wheel bodies 18 are received by the right and left non-diverging guide surfaces SS and a retracted position at which the third wheel bodies 18 are not received by the right and left non-diverging guide surfaces SS.

In other words, the facility is configured such that the guiding state can be switched to and among a left diverging guide state in which the first wheel body 16 is guided by the left diverging guide surface SL, a right diverging guide state in which the second wheel body 17 is guided by the right diverging guide surface SR, and a non-diverging guide state in which the third wheel bodies 18 are guided by the non-diverging guide surfaces SS by switching one of the first wheel body 16, the second wheel body 17, and the right and left third wheel bodies 18 to the received position (where the right and left third bodies are switched together) and by switching the rest of the wheel bodies to the retracted position. Incidentally, in the present embodiment, a travel direction switching mechanism (or travel direction switching means) for switching to and among the left diverging guide state, the right diverging guide state, and the non-diverging guide state is defined primarily by the pinion gears 20 which vertically move the first wheel body 16, the second wheel body 17, and the third wheel bodies 18.

In addition, in the present embodiment, the left diverging guide surface SL is configured to receive the first wheel body 16 such as to limit the article transport vehicle 2 in the left diverging travel state from leaning toward right. In other words, the article transport vehicle 2 in the left diverging travel state would tend to lean toward right because the right travel wheel 14 of the right and left travel wheels 14 in each of the front travel portion 10F and the back travel portion 10R is not placed on, or in contact with, the rail portion 1a although the left hand side travel wheel 14 is placed on, or in contact with, the rail portion 1a. However, the article transport vehicle 2 in the left diverging travel state is limited from leaning toward right by virtue of the fact that the first wheel body 16 is received by the left diverging guide surface SL.

In addition, in the present embodiment, the right diverging guide surface SR is configured to receive the second wheel body 17 such as to limit the article transport vehicle 2 in the right diverging travel state from leaning toward left. In other words, the article transport vehicle 2 in the right diverging travel state would tend to lean toward left because the left hand side travel wheel 14 of the right and left travel wheels 14 is not placed on, or in contact with, the rail portion 1a although the right hand side travel wheel 14 is placed on, or in contact with, the rail portion 1a. However, the article transport vehicle 2 in the right diverging travel state is limited from leaning toward left by virtue of the fact that the second wheel body 17 is received by the right diverging guide surface SR.

Figure 5:
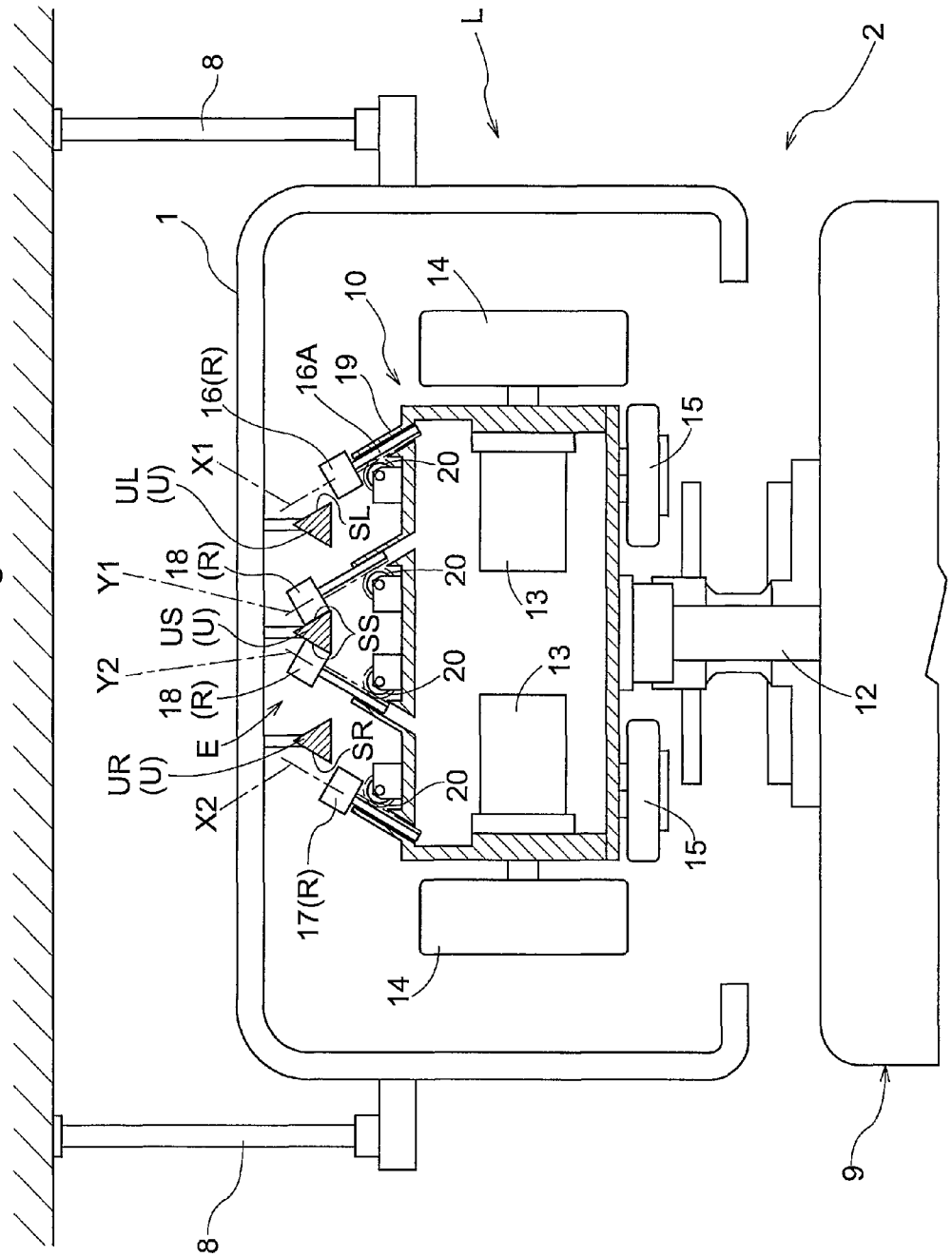
FIG. 5 is a front view showing a straight forward travel state of an article transport vehicle at a three-directional diverging portion.
Figure 6:
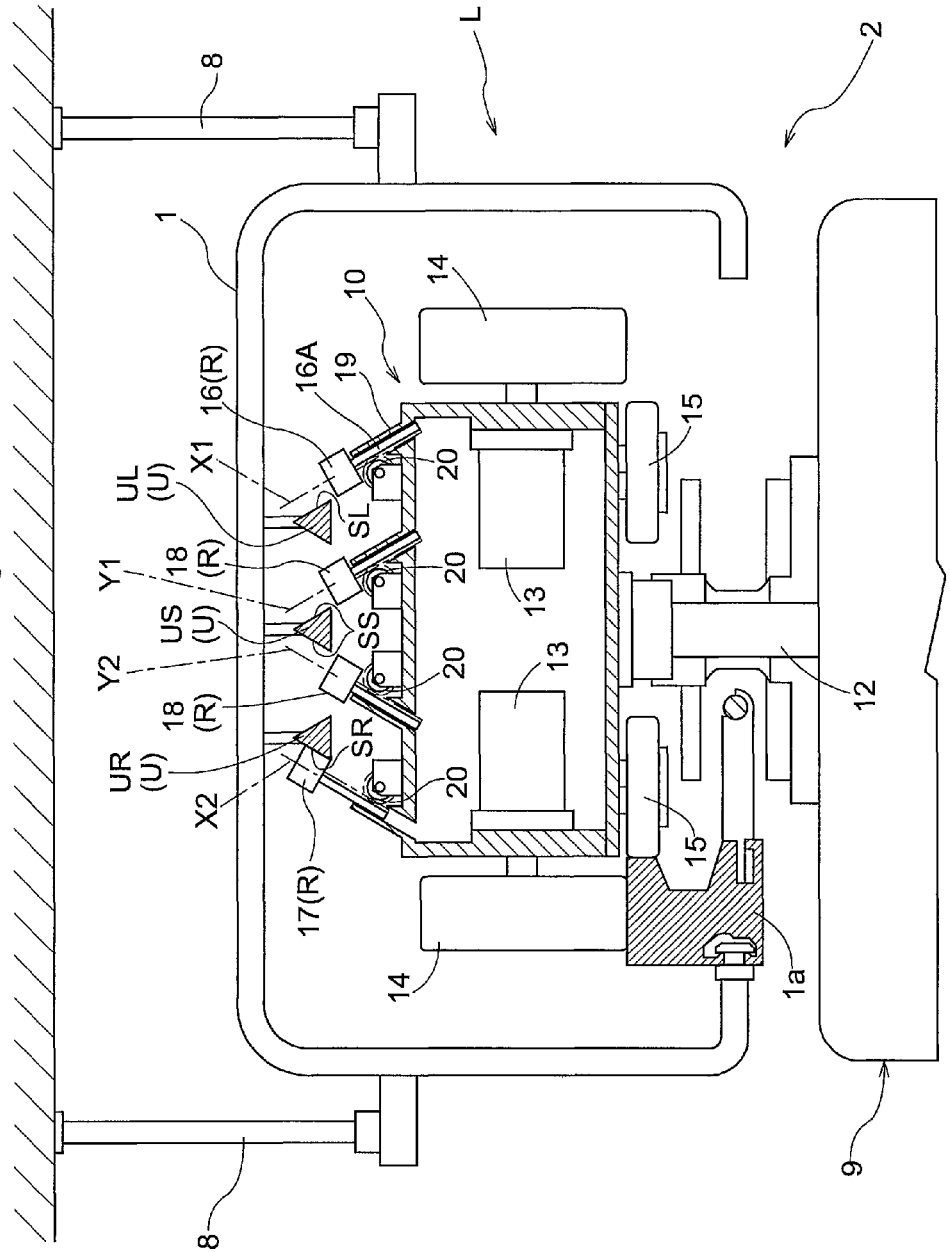
FIG. 6 is a front view showing a right diverging travel state of the article transport vehicle at the three-directional diverging portion.

In addition, as shown in FIG. 5, in the present embodiment, an auxiliary receiving mechanism E (auxiliary receiving means) which receives and supports the article transport vehicle 2 traveling between the pair of right and left rail portions 1a of the upstream-side travel path DK and the pair of right and left rail portions 1a of the straight forward path DS in the non-diverging travel state is defined using the non-diverging guide surfaces SS and the pair of right and left third wheel bodies 18. More specifically, because, as described above, the right and left non-diverging guide surfaces SS are upwardly sloped as seen along the longitudinal direction of the upper guide rails U and because the right and left third wheel bodies 18 rotate about pivot axes that are parallel to the non-diverging guide surfaces SS as seen along the longitudinal direction of the upper guide rails U, the article transport vehicle 2 is suspended and supported by the straight forward rail US of the upper guide rails U by virtue of the fact that the right and left third wheel bodies 18 are received and supported by the straight forward rail US of the upper guide rails U in the non-diverging guide state. Although the auxiliary receiving mechanism E is described here as a mechanism provided in the three-directional diverging portion M3, the mechanism (auxiliary receiving mechanism F for converging travel) provided in the three-directional converging portion N3 described below may also be referred to as an "auxiliary receiving mechanism". In other words, the mechanism with the reference symbol "E" is an "auxiliary receiving mechanism for diverging travel", and the mechanism with the reference symbol "F" described below is an "auxiliary receiving mechanism for converging travel" with both types of mechanisms collectively referred to as "auxiliary receiving mechanisms".

To describe in more detail, the auxiliary receiving mechanism E is configured as a mechanism (means) which suspends and supports the article transport vehicle 2 with the straight forward rail US of the upper guide rails U by allowing the right and left third wheel bodies 18 to function as auxiliary wheels provided at upper locations of the travel portion 10 and by allowing the straight forward rail US of the upper guide rails U to function as an auxiliary guide rail provided at an upper location of the three-directional diverging portion M3 to receive and support the right and left third wheel bodies 18 with the straight forward rail US of the upper guide rails U.

Figure 8:
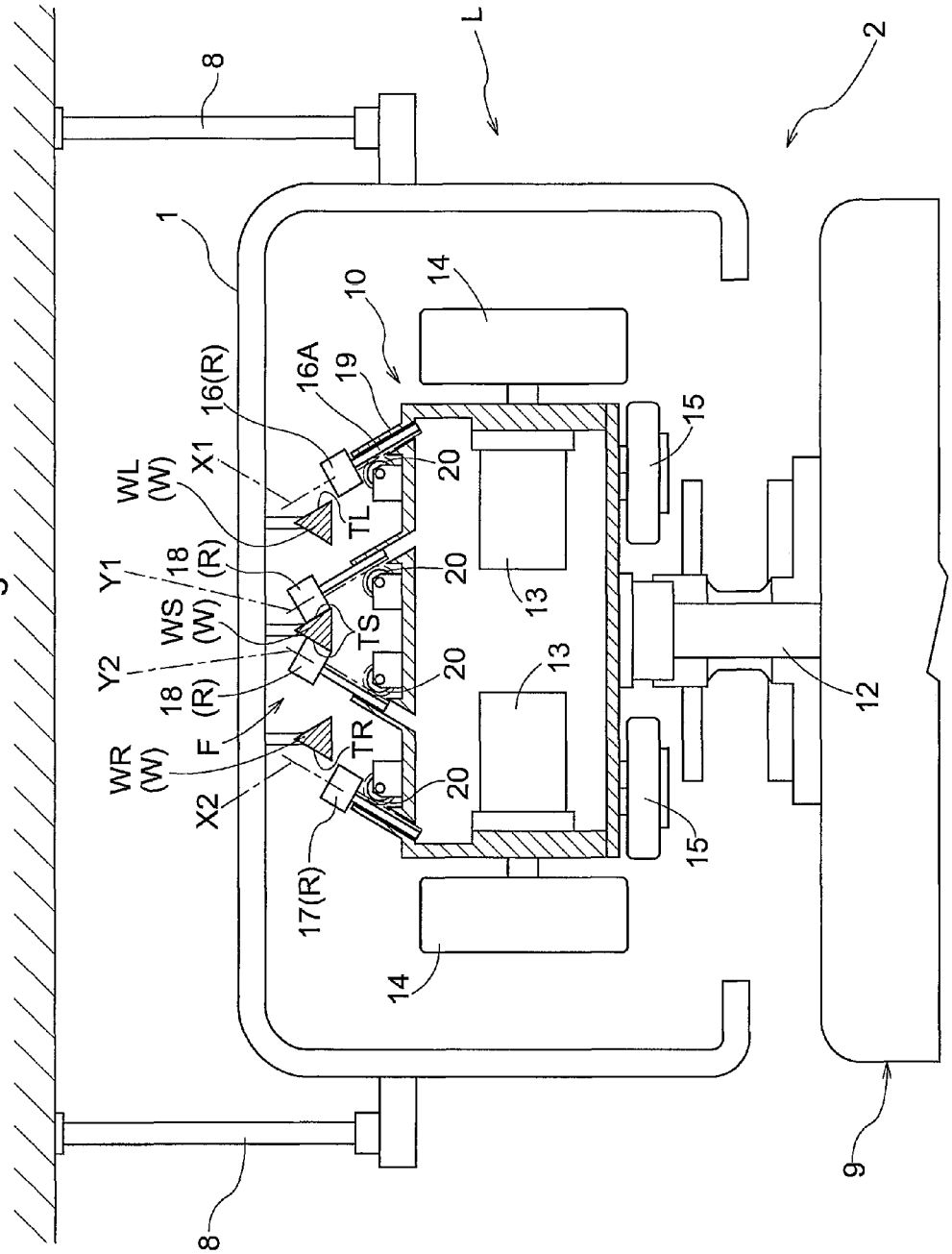
FIG. 8 is a front view showing a straight-forward converging travel state of the article transport vehicle at a three-directional converging portion.

As shown in FIGS. 7 and 8, upper guide rails W for converging travel (or converging upper guide rails W) for receiving the wheel bodies R are provided in the three-directional converging portion N3 such that the converging upper guide rails W are supported by the ceiling portion. In the present embodiment, the converging upper guide rails W include a rail WL for converging from the left (or left converging rail), a rail WR for converging from the right (or right converging rail), and a rail WS for straight forward converging travel (or straight forward converging rail). In other words, the left converging rail WL is located in the left hand side of the travel path 4: the right converging rail WR is located in the right hand side of the travel path 4: and, the straight forward converging rail WS is located between the left converging rail WL and the right converging rail WR.

The left converging rail WL is configured to extend from the left converging path GL to the downstream-side travel path portion GJ in a curve along the left converging path GL, as seen in plan view. The right converging rail WR is configured to extend from the right converging path RG to the downstream-side travel path portion GJ in a curve along the downstream-side travel path portion GJ, as seen in plan view. The straight forward converging rail WS is configured to extend straight forward along the downstream-side travel path GJ from the straight forward converging path GS, as seen in plan view.

Figure 9:
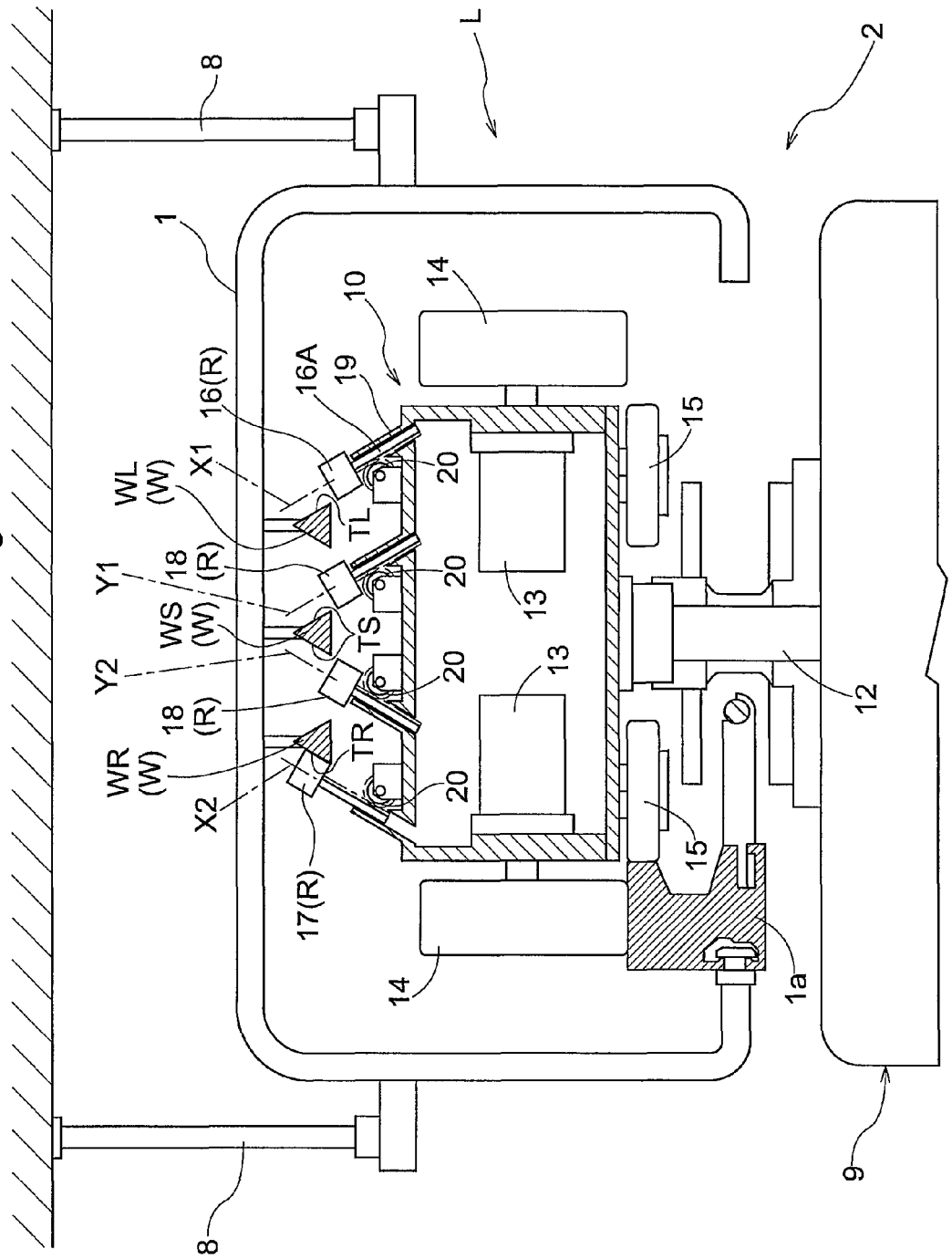
FIG. 9 is a front view a right converging travel state of the article transport vehicle at the three-directional converging portion.

As shown in FIGS. 8 and 9, each of the straight forward converging rail WS, the left converging rail WL, and the right converging rail WR is formed such that the cross-sectional shape taken at a plain that is perpendicular to the direction in which each rail extends is an isosceles triangle or similar, or close thereto. Therefore, each side face of the straight forward converging rail WS, of the left converging rail WL, and of the right converging rail WR is an upwardly sloped surface in the cross-sectional view taken at a plain that is perpendicular to the direction in which the converging travel upper guide rails W extend (or as seen in the longitudinal direction of the converging upper guide rails W).

Further, the right-tilted pivot axis Y1 and the left-tilted pivot axis Y2 of the left and right third wheel bodies 18 are configured to extend parallel to the left and right side faces of the straight forward converging rail WS in the cross-sectional view taken at a plain that is perpendicular to the direction in which converging upper guide rails W extend (or as seen in the longitudinal direction of the converging upper guide rails W). Similarly, the first pivot axis X1 of the first wheel body 16 is configured to extend parallel to a side face of the left converging rail WL. And the second pivot axis X2 of the second wheel body 17 is configured to extend parallel to a side face of the right converging rail WR.

And the left side face of the left converging rail WL is configured to define a left converging guide surface TL for causing the article transport vehicle 2 to converge from the left converging path GL into the downstream-side travel path GJ. Also, the right side face of the right converging rail WR is configured to define a right converging guide surface TR for causing the article transport vehicle 2 to converge from the right converging path GR into the downstream-side travel path GJ. In addition, the right and left side faces of the straight forward converging rail WS is configured to define straight forward converging guide surfaces TS for causing the article transport vehicle 2 to converge from the straight forward converging path GS into the downstream-side travel path GJ.

Thus, the first wheel body 16 in each of the front travel portion 10F and the back travel portion 10R is configured to be vertically moved by the pinion gear 20 which is actuated in the forward direction and the opposite direction by the electric motor to be switched between a received position at which the first wheel body 16 is received by the left converging guide surface TL of the left converging rail WL and a retracted position at which the first wheel body 16 is not received by the left converging guide surface TL. Similarly, the second wheel body 17 is configured to be vertically moved by the pinion gear 20 which is actuated in the forward direction and the opposite direction by the electric motor to be switched between a received position at which the second wheel body 17 is received by the right converging guide surface TR of the right converging rail WR and a retracted position at which the second wheel body 17 is not received by the right converging guide surface TR.

In addition, the pair of right and left third wheel bodies 18 are configured to be vertically moved by the pinion gears 20 each of which is actuated in the forward direction and the opposite direction by an electric motor to be switched between a received position at which the third wheel bodies 18 are received by the right and left straight forward converging, guide surfaces TS and a retracted position at which the third wheel bodies 18 are not received by the right and left straight forward converging guide surfaces TS.

In other words, the facility is configured such that the guiding state can be switched to and among a left converging guide state in which the first wheel body 16 is guided by the left converging guide surface TL, a right converging guide state in which the second wheel body 17 is guided by the right converging guide surface TR, and a straight forward converging guide state in which the third wheel bodies 18 are guided by the straight forward converging guide surfaces TS by switching one of the first wheel body 16, the second wheel body 17, and the right and left third wheel bodies 18 to the received position (where the right and left third bodies are switched together) and by switching the rest of the wheel bodies to the retracted position. Incidentally, in the present embodiment, a converging state switching mechanism (or converging state switching means) for switching to and among the left converging guide state, the right converging guide state, and the straight forward guide state is defined primarily by the pinion gears 20 which vertically move the first wheel body 16, the second wheel body 17, and the third wheel bodies 18.

In addition, in the present embodiment, the left converging guide surface TL is configured to receive the first wheel body 16 such as to limit the article transport vehicle 2, that converges into the downstream-side travel path GJ from the left converging path GL, from leaning toward right. In other words, the article transport vehicle 2 in the left converging travel state would tend to lean toward right because the right hand side travel wheel 14 of the right and left travel wheels 14 in each of the front travel portion 10F and the back travel portion 10R is not placed on, or in contact with, the rail portion 1a although the left hand side travel wheel 14 is placed on, or in contact with, the rail portion 1a. However, the article transport vehicle 2 in the left converging travel state is limited from leaning toward right by virtue of the fact that the first wheel body 16 is received by the left converging guide surface TL.

In addition, in the present embodiment, the right converging guide surface TR is configured to receive the second wheel body 17 such as to limit the article transport vehicle 2, that converges into the downstream-side travel path GJ from the right converging path GR, from leaning toward left. In other words, the article transport vehicle 2 in the right converging travel state would tend to lean toward left because the left hand side travel wheel 14 of the right and left travel wheels 14 is not placed on, or in contact with, the rail portion 1a although the right hand side travel wheel 14 is placed on, or in contact with, the rail portion 1a. However, the article transport vehicle 2 in the right converging travel state is limited from leaning toward left by virtue of the fact that the second wheel body 17 is received by the left converging guide surface TR.

In addition, in the present embodiment, a converging travel auxiliary receiving mechanism F (converging travel auxiliary receiving means), which receives and supports the article transport vehicle 2 traveling between the pair of right and left rail portions 1a of the straight forward converging path GS and the pair of right and left rail portions 1a of the downstream-side travel path GJ in the straight forward travel state in which the article transport vehicle 2 converges into the downstream-side travel path GJ from the straight forward converging path GS, is defined using the straight forward converging guide surfaces TS and the pair of right and left third wheel bodies 18. More specifically, because, as described above, the right and left straight forward converging guide surfaces TS are upwardly sloped as seen along the longitudinal direction of the converging upper guide rails W and because the right and left third wheel bodies 18 rotate about pivot axes that are parallel to the straight forward converging guide surfaces TS as seen along the longitudinal direction of the converging upper guide rails W, the article transport vehicle 2 is suspended and supported by the straight forward converging rail WS of the converging upper guide rails W by virtue of the fact that the right and left third wheel bodies 18 are received and supported by the straight forward converging rail WS of the converging upper guide rails W in the straight forward converging guide state.

To describe in more detail, the converging travel auxiliary receiving mechanism F is configured as a mechanism (means) which suspends and supports the article transport vehicle 2 with the straight forward converging rail WS of the converging upper guide rails W by allowing the right and left third wheel bodies 18 to function as auxiliary wheels provided at upper locations of the travel portion 10 and by allowing the straight forward converging rail WS of the converging upper guide rails W to function as an auxiliary guide rail provided at an upper location of the three-directional converging portion N3 to receive and support the right and left third wheel bodies 18 with the straight forward converging rail WS of the converging upper guide rails W.

The two-directional diverging portions M at locations where the diverging connecting path 5A is connected to the travel path 4 and the two-directional diverging portions M at locations where the converging connecting path 5B is connected to the secondary travel path 3 are described next. That is, each three-directional diverging portion M3 has the upper guide rails U that includes the left diverging rail UL, the right diverging rail UR, and the straight forward rail US as described above. In contrast, upper guide rails U including a left diverging rail UL and a straight forward rail US are installed in each two-directional diverging portion M at a location where the diverging connecting path 5A is connected to the travel path 4. And the upper guide rails U including a right diverging rail UR and a straight forward rail US are installed in each two-directional diverging portion M at location where the converging connecting path 5B is connected to the secondary travel path 3.

In addition, in each two-directional diverging portion M, the rail portion 1a of the pair of right and left rail portions 1a of the guide rail 1, that is on the side of the diverging path where the left diverging path DL or the right diverging path DR exists, is discontinuous in the location in which the diverging portion M is formed whereas the rail portion 1a that is located on the side that is away from the left diverging path DL or the right diverging path DR is continuous in the location in which the diverging portion M is formed. And the rail portion 1a of the pair of right and left rail portions 1a that is on the side of the diverging path is connected to the pair of right and left rail portions 1a of the left diverging path DL or the right diverging path DR.

Thus, the third wheel bodies 18 are received and guided by the straight forward rail US when traveling straight forward whereas the first wheel body 16 or the second wheel body 17 is received and guided by the left diverging rail UL or the right diverging rail UR during a diverging travel. Incidentally, in the two-directional diverging portion M, because the rail portion 1a of the pair of right and left rail portions 1a that is away from the diverging path is continuous even in the location in which the diverging portion M is formed, the third wheel bodies 18 are switched to the state in which only one of the right and left third wheel bodies 18 is received and guided by the straight forward rail US when traveling straight forward, in order to limit the article transport vehicle 2 from leaning toward the side in which the rail portions 1a of the diverging path exist.

The two-directional converging portions N at locations where the diverging connecting path 5A is connected to a secondary travel path 3 and the two-directional converging portions N at location where the converging connecting path 5B is connected to the travel path 4 are described next. That is, each three-directional converging portion N3 has the converging upper guide rail W that includes the left converging rail WL, the right converging rail WR, and the straight forward converging rail WS. In contrast, the converging upper guide rails W including a right converging rail WR and a straight forward converging rail WS are installed in each two-directional converging portion N at a location where a diverging connecting path 5A is connected to a secondary travel path 3. And the converging upper guide rails W including a left converging rail WL and a straight forward converging rail WS are installed in each two-directional converging portion N at location where a converging connecting path 5B is connected to the travel path 4.

In addition, in each two-directional converging portion N, the rail portion 1a of the pair of right and left rail portions 1a of the guide rail 1, that is on the side of the converging path where the left converging path GL or the right converging path GR exists, is discontinuous in the location in which the converging portion N is formed whereas the rail portion 1a that is located on the side that is away from the left converging path GL or the right converging path GR is continuous in the location in which the converging portion N is formed. And the rail portion 1a of the pair of right and left rail portions 1a that is on the side of the converging path is connected to the pair of right and left rail portions 1a of the left converging path DL or the right converging path DR.

Thus, the third wheel bodies 18 are received and guided by the straight forward converging rail WS when the article transport vehicle 2 travels straight forward into the converging area whereas the first wheel body 16 or the second wheel body 17 is received and guided by the left converging rail WL or the right converging rail WR when the transport vehicle 2 converges into the converging area from the left or right. Incidentally, in the two-directional converging portion N, because the rail portion 1a of the pair of right and left rail portions 1a that is located away from the converging path is continuous even in the location in which the converging portion N is formed, the third wheel bodies 18 are switched to the state in which only one of the right and left third wheel bodies 18 is received and guided by the straight forward converging rail WS when traveling straight forward into the converging area, in order to limit the article transport vehicle 2 from leaning toward the side in which the rail portions 1a of the converging path exist.

As described above, in the first embodiment, by providing the three-directional diverging portion M3 and the three-directional converging portion N3, a shorter route can be selected as a travel route when the article transport vehicles 2 are caused to travel from a transport origin to a transport destination, which makes it possible to transport articles efficiently.

While an example is presented in the present embodiment in which the left diverging guide surface SL and the left converging guide surface TL are formed to be upwardly sloped and in which the first wheel body 16 is rotated about an inclined axis, the left diverging guide surface SL and the left converging guide surface TL may be formed to extend vertically and the first wheel body 16 may rotate about a vertically extending axis.

Similarly, while an example is presented in the present embodiment in which the right diverging guide surface SR and the right converging guide surface TR are formed to be upwardly sloped and in which the second wheel body 17 is rotated about an inclined axis, the right diverging guide surface SR and the right converging guide surface TR may be formed to extend vertically and the second wheel body 17 may rotate about a vertically extending axis.

[Second Embodiment]

Figure 10:
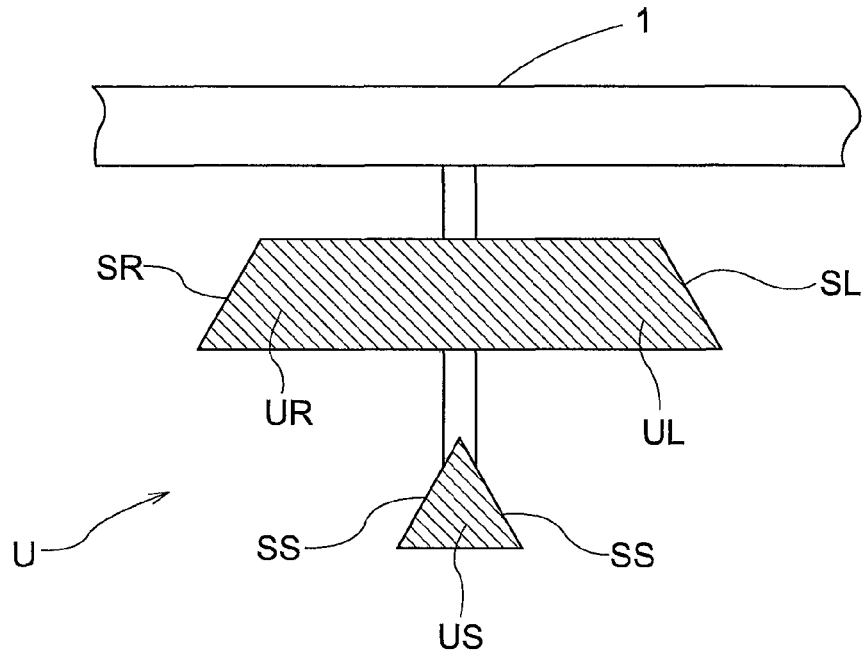
FIG. 10 is a vertical sectional front view showing the upper guide rail of the second embodiment.

Second embodiment is described with reference to FIG. 10 next. The second embodiment has the same configuration as the first embodiment except that the configurations of the upper guide rail U and the converging upper guide rail W are different from those in the first embodiment. Accordingly, only the configurations of the upper guide rail U and the converging upper guide rail W are described so as not to repeat the descriptions of identical elements.

In this second embodiment, the upper guide rail U is configured to form a frame that is generally cross-shaped as seen in the longitudinal direction with a left diverging rail UL and a right diverging rail UR formed next to each other in the lateral direction in the upper portion of the upper guide rail U and with a straight forward rail US formed in its lower portion.

In addition, while not shown and similarly to how the upper guide rail U is configured, a converging upper guide rail W is configured to form a frame that is generally cross-shaped as seen in the longitudinal direction with a left converging rail WL and a right converging rail WR formed next to each other in the lateral direction in the upper portion of the converging upper guide rail W and with a straight forward converging rail WS formed in its lower portion.

In the second embodiment, since the upper guide rail U is configured to form a single frame including the left diverging rail UL, the right diverging rail UR, and the straight forward rail US and since the converging upper guide rail W is similarly configured to form a single frame including the left converging rail WL, the right converging rail WR, and the straight forward converging rail WS, it is easy to install the upper guide rail U and the converging upper guide rail W.

[Third Embodiment]

Third embodiment is described next. This third embodiment has the same configuration as that of the first embodiment except that the configurations of the straight forward rail US of the upper guide rail U and of the straight forward converging rail WS of the converging upper guide rail W as well as the configuration of the third wheel bodies 18 are different from those in the first embodiment. Accordingly, only the configurations of the straight forward rail US of the upper guide rail U and of the straight forward converging rail WS of the converging upper guide rail W as well as the configuration of the third wheel bodies 18 are described here so as not to repeat the descriptions of identical elements.

Figure 11:
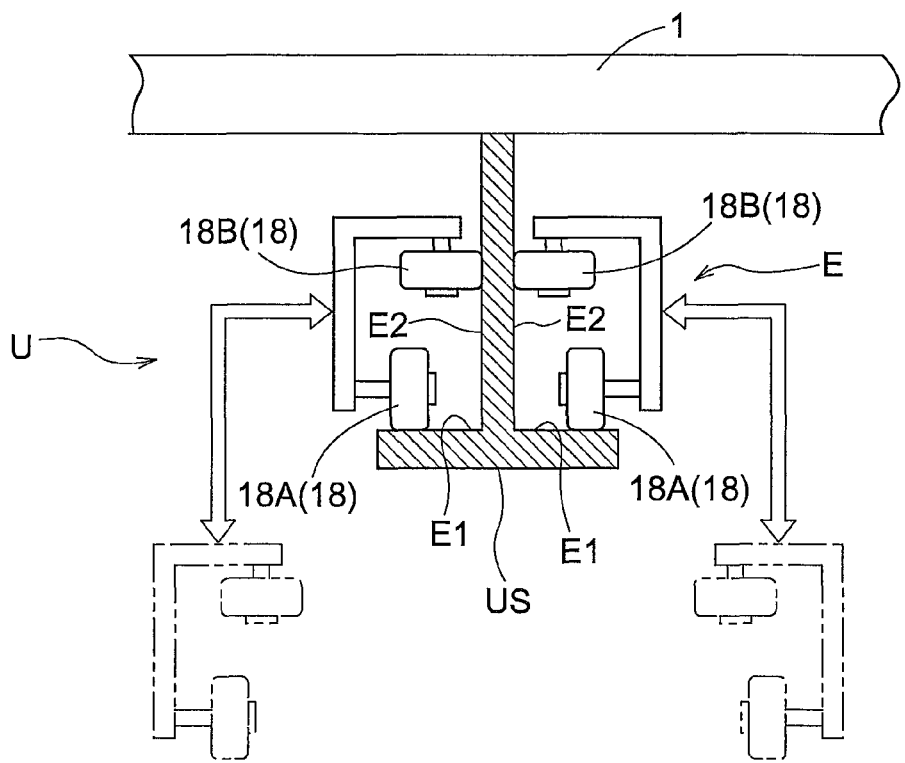
FIG. 11 is a vertical sectional front view showing the rails for straight-forward travel of the third embodiment.

As shown in FIG. 11, in the third embodiment, the straight forward rail US of the upper guide rail U is formed in the general shape of an inverted T as seen in the longitudinal direction and is configured to define a pair of right and left upwardly facing surfaces E1 as well as a pair of right and left laterally facing surfaces E2. And each of the pair of right and left third wheel bodies 18 includes a first wheel body portion 18A which rotates about a horizontally extending axis and which travels on the upwardly facing surface E1 and a second wheel body portion 18B which rotates about a vertically extending axis and which travels on the laterally facing surface E2.

While not shown but similarly to the straight forward rail US of the upper guide rail U, the straight forward converging rail WS of the converging upper guide rail W is formed in the general shape of an inverted T as seen in the longitudinal direction and is configured to define a pair of right and left upwardly facing surfaces on which the first wheel body portions 18A travel as well as a pair of right and left laterally facing surfaces which second wheel body portions 18B are in contact with.

Therefore, the auxiliary receiving mechanism E is configured to be means for suspending and supporting the article transport vehicle 2 by virtue of the fact that the first wheel body portions 18A of the third wheel body 18 are received and supported by the straight forward rail US. And the converging travel auxiliary receiving mechanism F is configured to be means for suspending and supporting the article transport vehicle 2 by virtue of the fact that the first wheel body portions 18A of the third wheel body 18 are received and supported by the straight forward converging rail US.

[Fourth Embodiment]

Fourth embodiment is described next. The configuration of this fourth embodiment is the same as that of the first embodiment except that the configuration of the auxiliary receiving mechanism E is different from that of the first embodiment. Therefore, only the elements that are different from those in the first embodiment are described so as not to repeat the descriptions for the elements in the first embodiments that are identical to those in the present embodiment.

Figure 12:
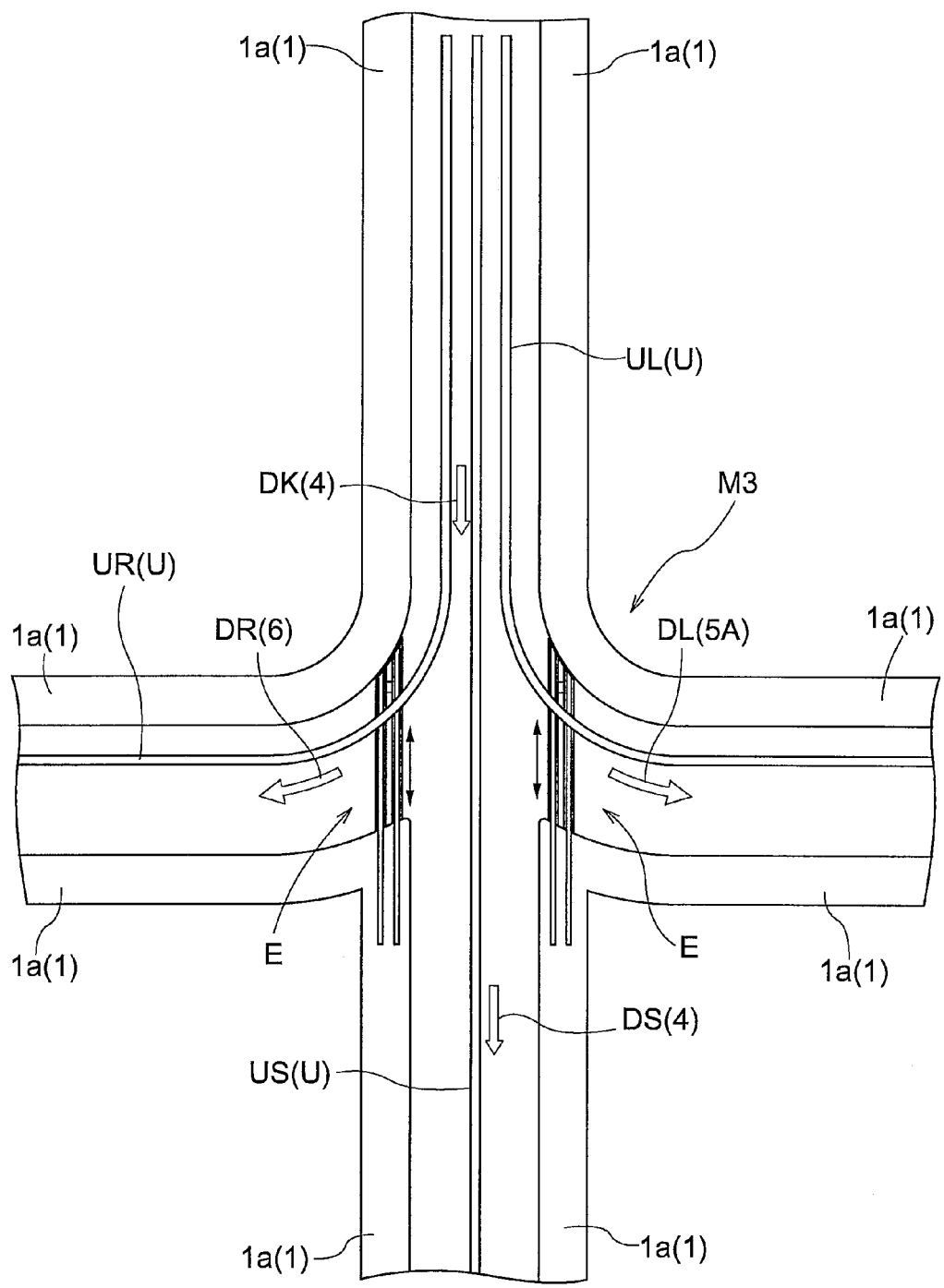
FIG. 12 is a plan view of the three-directional diverging portion of the fourth embodiment.
Figure 13:
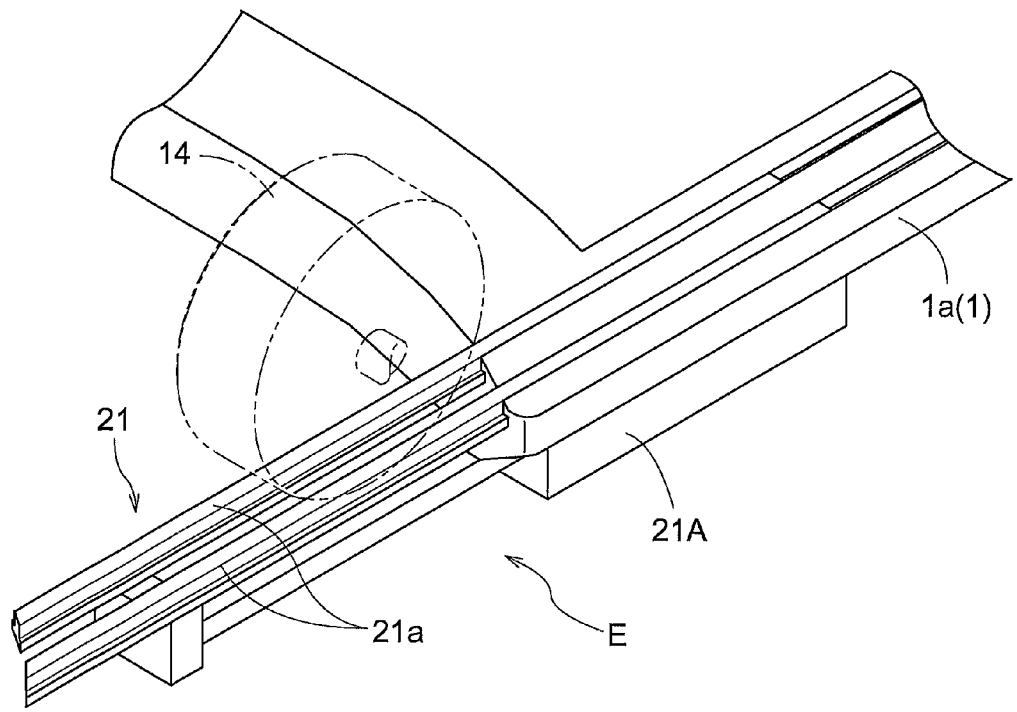
FIG. 13 is a perspective view of a principal part of the embodiment shown in FIG. 12.
Figure 14:
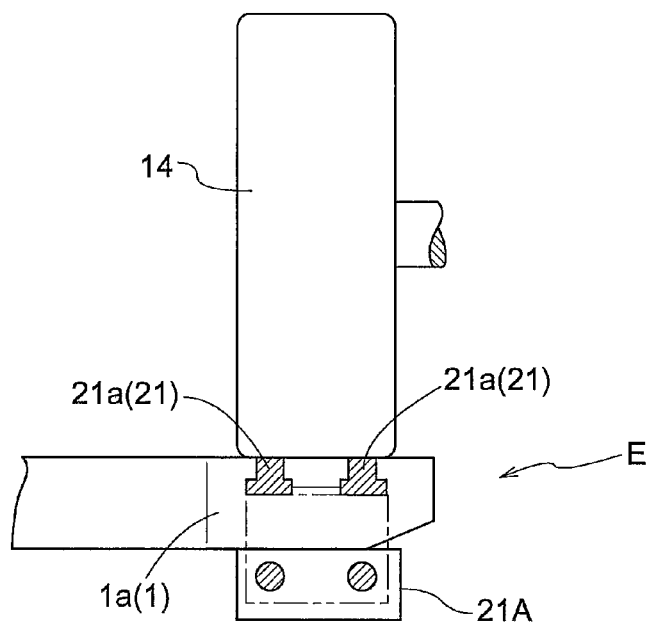
FIG. 14 is a front view of the principal part of the embodiment shown in FIG. 13.

As shown in FIGS. 12-14, a movable rail 21 that can slide is installed to each of the right and left rail portion 1a of the straight forward path DS that extends straight forward from the three-directional diverging portion M3. That is, the movable rails 21 are configured to be slidingly moved by an actuator 21A, such as an electrically actuated cylinder, between a projected state in which the movable rails 21 are continuous with respective rail portions 1a of the upstream-side travel path DK of the three-directional diverging portion M3 and a state in which the movable rails 21 are retracted to within the right and left rail portions 1a of the straight forward path DS.

In addition, each movable rail 21 includes a pair of right and left rail members 21a that are so located to be within the lateral width of each travel wheel 14. And each rail member 21a is inserted in, and for sliding movement (slidingly movable) within, a groove that is formed in the top surface portion of the rail portion 1a of the guide rail 1. Further, each rail member 21a has a cross-sectional shape, taken at a vertical plane, that has a greater width in its lower portion than in its upper portion so as to prevent the rail member 21a from being lifted off the rail portion 1a.

Therefore, the auxiliary receiving mechanism E is configured to be a mechanism (means) which receives the travel wheels 14 with the movable rails 21 in the non-diverging guide state in which the article transport vehicle 2 is caused to travel straight forward, by switching the movable rails 21 to the projected state.

Incidentally, in this fourth embodiment, the non-diverging guide surfaces SS of the straight forward rail US in the upper guide rail U are formed such that they extend vertically and the third wheel bodies 18 are rotated about vertically extending axes.

While not shown, the movable rails 21 may be used to define the converging travel auxiliary receiving mechanism F, similarly to the auxiliary receiving mechanism E.

[Fifth Embodiment]

Fifth embodiment is described next. The configuration of this fifth embodiment is the same as that of the first embodiment except that the configuration of the auxiliary receiving mechanism or means E is different from that of the first embodiment. Therefore, only the elements that are different from those in the first embodiment are described so as not to repeat the descriptions for the elements in the first embodiments that are identical to those in the present embodiment.

Figure 15:
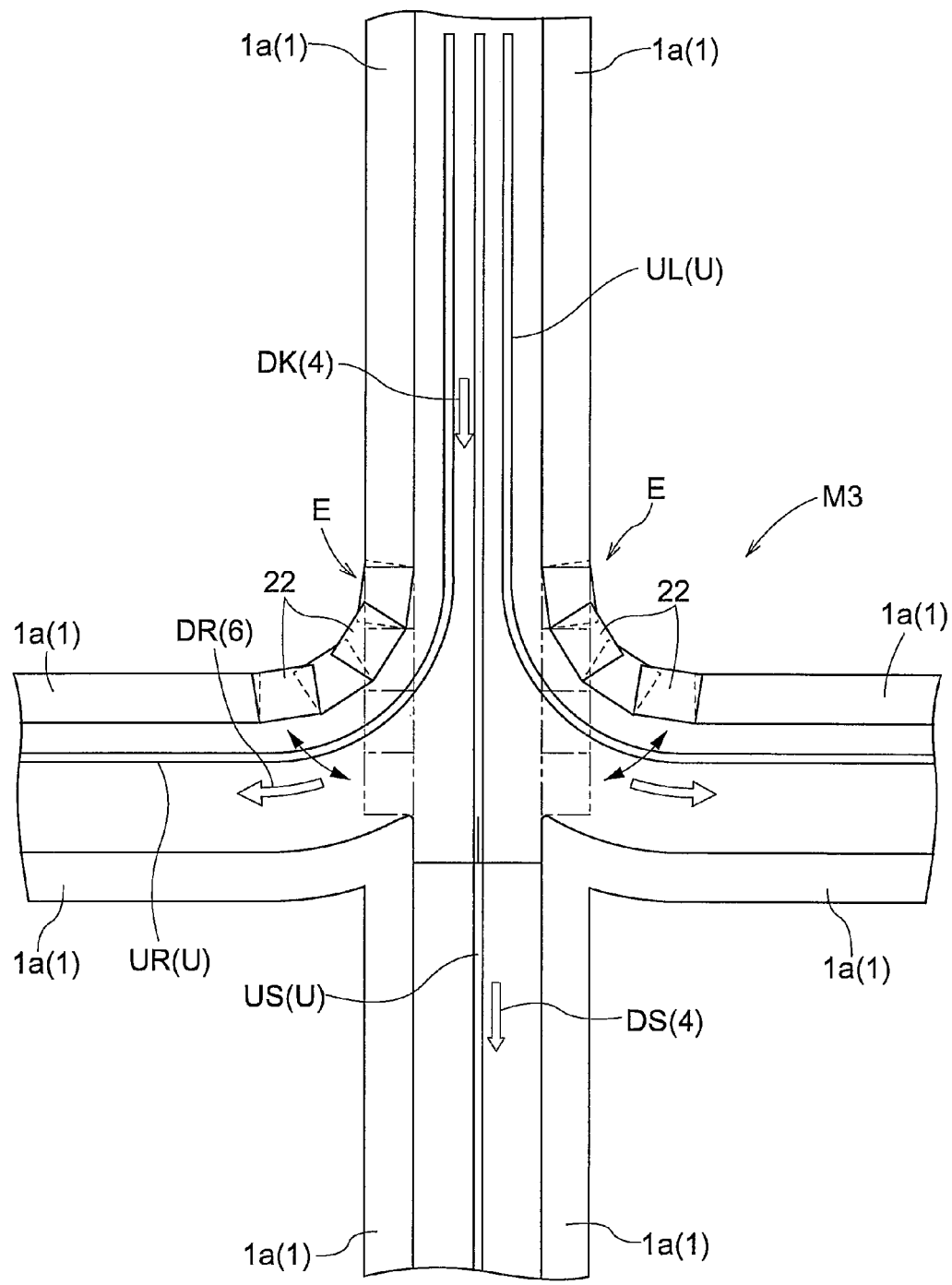
FIG. 15 is a plan view of the three-directional diverging portion of the fifth embodiment.

As shown in FIG. 15, a part of the left rail portion 1a, of the pair of right and left rail portions 1a of the left diverging path DL, that is close to the three-directional diverging portion M3, is configured to be switched (switchable) between a curved state in which the part of the left rail portion 1a curves along the left diverging path DL and a straight state in which the part of the left rail portion 1a extends straight toward the straight forward path DS. Also, a part of the right rail portion 1a, of the pair of right and left rail portions 1a of the right diverging path DR, that is close to the three-directional diverging portion M3, is configured to be switched (switchable) between a curved state in which the part of the left rail portion 1a curves along the right diverging path DR and a straight state in which the part of the left rail portion 1a extends straight toward the straight forward path DS.

Incidentally, as a specific configuration for switching the rail portion 1a between the curved state and the straight state, the rail portion 1a is constructed by connecting a plurality of rail components such that the rail portion 1a can be curved and, while not shown, an actuator for switching between the curved state and the straight state is installed.

Therefore, the auxiliary receiving mechanism E is configured to be means for receiving the travel wheels 14 by switching the portion of the left rail portion 1a of the left diverging path DL that is close to the three-directional diverging portion M3 and the portion of the right rail portion 1a of the right diverging path DR that is close to the three-directional diverging portion M3 to the straight state in the non-diverging guide state in which the article transport vehicle 2 is caused to travel straight forward.

While not shown, the converging travel auxiliary receiving mechanism F may have the same configuration as the auxiliary receiving mechanism E of this fifth embodiment.

[Sixth Embodiment]

Sixth embodiment is described next. The configuration of this sixth embodiment is the same as that of the first embodiment except that the configuration of the auxiliary receiving mechanism E is different from that of the first embodiment. Therefore, only the elements that are different from those in the first embodiment are described so as not to repeat the descriptions for the elements in the first embodiments that are identical to those in the present embodiment.

Figure 16:
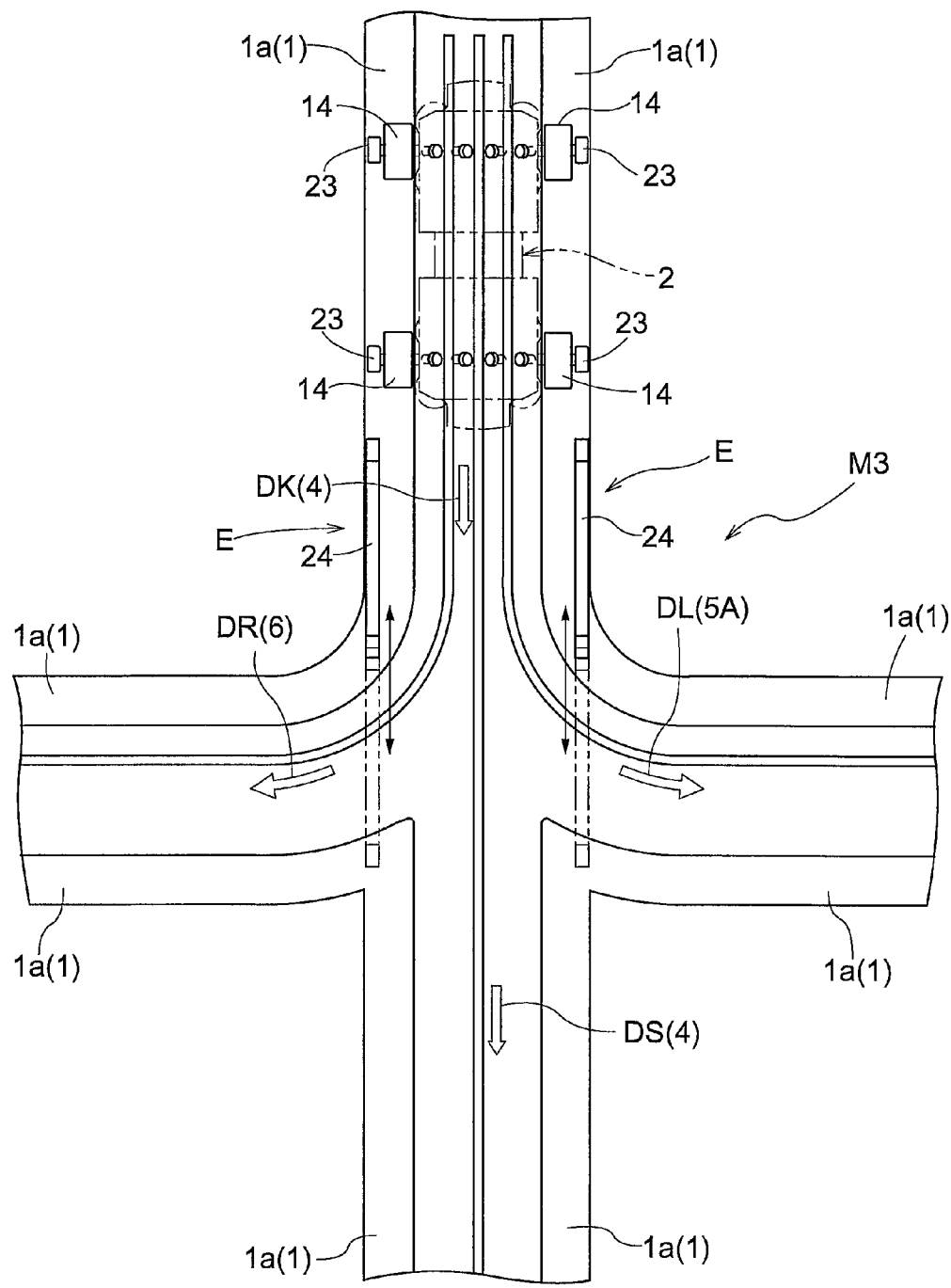
FIG. 16 is a plan view of the three-directional diverging portion of the sixth embodiment.
Figure 17:
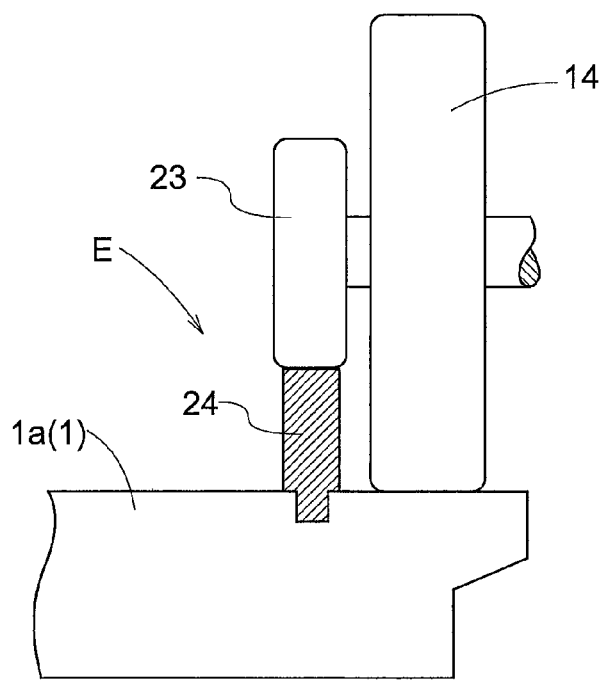
FIG. 17 is a front view of a principal part of the embodiment shown in FIG. 16.
Figure 18:
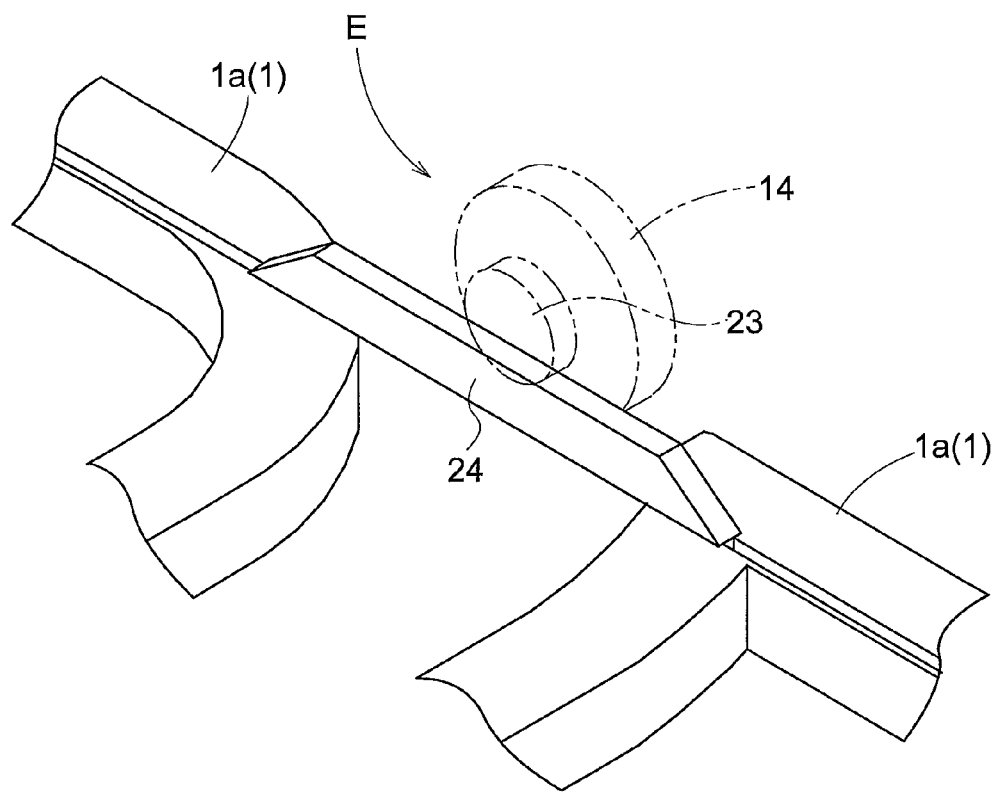
FIG. 18 is a perspective view of the principal part of the embodiment shown in FIG. 16.

As shown in FIGS. 16-18, a small wheel 23 with smaller radius than the travel wheels 14 is provided to the lateral side of each travel wheel 14 of the article transport vehicle 2 to rotate in unison with the travel wheel 14. In addition, slide rails 24 on which the small wheels 23 travel are provided to upper portions of the right and left rail portions 1a of the upstream-side travel path DK of the three-directional diverging portion M3 such that the slide rails 24 are slidingly moved with an actuator (not shown), such as an electrically actuated cylinder, between a projected state in which the slide rails 24 span between the right and left rail portion 1a of the upstream-side travel path DK and the right and left rail portions 1a of the straight forward path DS and a retracted state in which the slide rails 24 are retracted to above the right and left rail portions 1a of the upstream-side travel path DK.

Therefore, the auxiliary receiving mechanism E is configured to be a mechanism (means) which receives the small wheels 23 by switching the slide rails 24 to the projected state in the non-diverging guide state in which the article transport vehicle 2 is caused to travel straight forward.

While not shown, the converging travel auxiliary receiving mechanism F may have the same configuration as the auxiliary receiving mechanism E of this sixth embodiment.

[Alternative Embodiments]

(1) In the first to sixth embodiments described above, examples were described in which the travel portion 10 of the article transport vehicle 2 includes the front travel portions 10F and the back travel portions 10R that are separately provided. However, the travel portion 10 does not have to be divided into two portions.

(2) In the first to sixth embodiments described above, examples are described in which the secondary travel paths 3 which extend by way of article processors P are located at lateral sides of the loop-shaped travel path 4. However, various changes may be made to the configuration of the paths along which the article transport vehicles 2 travel.

(3) In the first to sixth embodiments described above, examples were described in which both the three-directional diverging portions M3 and the three-directional converging portions N3 are installed. However, only the three-directional diverging portions M3 may be provided or only the three-directional converging portions N3 may be provided.

(4) In the first to sixth embodiments described above, examples are described in which the first wheel body 16, the second wheel body 17, and a pair of third wheel bodies 18 are provided. However, the left wheel body of the third wheel bodies 18 may also function as the first wheel body 16 and the right wheel body of the third wheel bodies 18 may also function as the second wheel body 17, for example, by providing the pair of third wheel bodies 18 such that they can be moved (movable) in the vehicle body lateral direction.

(5) In the first embodiment described above, the first wheel body 16, the second wheel body 17, and the pair of third wheel bodies 18 are configured to be switched between the received position and the retracted position by allowing them to be slidingly moved along respective axis of rotation. However, the position of each wheel body may be switched between the received position and the retracted position, for example, by a combination of a motion in the vehicle body lateral direction and a motion in the vehicle body vertical direction. And various changes may be made to the specific configuration for allowing the wheel bodies to be switched between the received position and the retracted position.

What is claimed is:

1. An article transport facility of a ceiling installation type comprising:
    an article transport vehicle including a travel portion, an article holding portion located under the travel portion, and right and left travel wheels at each of a front location and a back location of the travel portion;
    guide rails provided along a travel path for the article transport vehicle,
    wherein the guide rails include a pair of right and left rail portions that are spaced apart from each other in a rail lateral direction, and wherein the pair of right and left rail portions have travel surfaces on which the travel wheels travel;
    wherein the guide rails include: a three-directional diverging portion at which the travel path is diverged into three directions as the travel path extends from an upstream-side travel path toward a downstream-side travel path; a straight forward path; a left diverging path; and a right diverging path; with each of the straight forward path, the left diverging path, and the right diverging path diverging and extending from the three-directional diverging portion;
    wherein the straight forward path is configured such that the pair of right and left rail portions provided along the straight forward path are discontinuous with and spaced apart from the pair of right and left rail portions provided along the upstream-side travel path of the three-directional diverging portion by a predetermined straight forward rail distance in a path longitudinal direction;
    wherein the left diverging path is configured such that a left rail portion of the pair of right and left rail portions provided along the left diverging path is continuous with a left rail portion of the pair of right and left rail portions of the upstream-side travel path,
    wherein the right diverging path is configured such that a right rail portion of the pair of right and left rail portions provided along the right diverging path is continuous with a right rail portion of the pair of right and left rail portions of the upstream-side travel path,
    wherein the article transport vehicle includes a guided member for changing paths that is provided at a location above the travel wheels of the travel portion and a travel direction switching mechanism which switches a state in which the guided member is guided,
    wherein the article transport facility further comprises an upper guide rail that receives the guided member and an auxiliary receiving mechanism that receives and supports the article transport vehicle traveling in the three-directional diverging portion and between the pair of right and left rail portions of the upstream-side travel path and the pair of right and left rail portions of the straight forward path,
    wherein the upper guide rail is configured to have a left diverging guide surface for switching to a left diverging travel state in which the article transport vehicle is caused to diverge into and travel along the left diverging path, a right diverging guide surface for switching to a right diverging travel state in which the article transport vehicle is caused to diverge into and travel along the right diverging path, and a non-diverging guide surface for switching to a non-diverging travel state in which the article transport vehicle is caused to travel straight forward,
    wherein the travel direction switching mechanism is configured to switch the state in which the guided member is guided among a left diverging guide state in which the guided member is guided by the left diverging guide surface, a right diverging guide state in which the guided member is guided by the right diverging guide surface, and a non-diverging guide state in which the guided member is guided by the non-diverging guide surface, wherein the left diverging guide surface is configured to receive the guided member such as to limit the article transport vehicle in the left diverging travel state from leaning toward right, wherein the right diverging guide surface is configured to receive the guided member such as to limit the article transport vehicle in the right diverging travel state from leaning toward left, and wherein the auxiliary receiving mechanism is configured to receive and support the article transport vehicle traveling between the pair of right and left rail portions of the upstream-side travel path and the pair of right and left rail portions of the straight forward path in the non-diverging travel state.

2. The article transport facility of a ceiling installation type as defined in claim 1, wherein the article transport vehicle further includes an auxiliary wheel at a location above the travel portion, wherein the auxiliary wheel is configured to be switched between a received position in which the auxiliary wheel is received and supported by an auxiliary guide rail provided at a location above the three-directional diverging portion and a retracted position in which the auxiliary wheel is not received by the auxiliary guide rail;

wherein the auxiliary receiving mechanism is configured to suspend and support the article transport vehicle with the auxiliary guide rail by receiving the auxiliary wheel with the auxiliary guide rail.

3. The article transport facility of a ceiling installation type as defined in claim 2, wherein the non-diverging guide surface is configured to define an upwardly sloped surface in a cross-sectional view taken at a plane that is perpendicular to a direction in which the upper guide rail extends, wherein the guided member includes a wheel body that is rotatable about a pivot axis extending parallel to the non-diverging guide surface in the cross-sectional view, wherein the upper guide rail is configured to function as the auxiliary guide rail and the guided member is configured to function as the auxiliary wheel.

4. The article transport facility of a ceiling installation type as defined in claim 3, wherein the guided member that functions as the auxiliary wheel is configured to be switched between the received position and the retracted position through movements along an extending direction of the pivot axis that is parallel to the non-diverging guide surface.

5. The article transport facility of a ceiling installation type as defined in claim 1, wherein the straight forward rail distance is defined to be smaller than a fore and aft wheel distance which is a distance in the fore and aft direction between the travel wheels provided to the travel portion of the article transport vehicle.

6. The article transport facility of a ceiling installation type as defined in claim 2, wherein the straight forward rail distance is defined to be smaller than a fore and aft wheel distance which is a distance in the fore and aft direction between the travel wheels provided to the travel portion of the article transport vehicle.

7. The article transport facility of a ceiling installation type as defined in claim 3, wherein the straight forward rail distance is defined to be smaller than a fore and aft wheel distance which is a distance in the fore and aft direction between the travel wheels provided to the travel portion of the article transport vehicle.

8. The article transport facility of a ceiling installation type as defined in claim 4, wherein the straight forward rail distance is defined to be smaller than a fore and aft wheel distance which is a distance in the fore and aft direction between the travel wheels provided to the travel portion of the article transport vehicle.

9. An article transport facility of a ceiling installation type comprising:

an article transport vehicle including a travel portion, an article holding portion located under the travel portion, and right and left travel wheels at each of a front location and a back location of the travel portion;

guide rails provided along a travel path for the article transport vehicle, wherein the guide rails include a pair of right and left rail portions that are spaced apart from each other in a rail lateral direction, and wherein the pair of right and left rail portions have travel surfaces on which the travel wheels travel;

wherein the guide rails include: a three-directional converging portion at which the travel path is converged from three directions as the travel path extends from an upstream-side travel path toward a downstream-side travel path; a straight forward converging path; a left converging path; and a right converging path; with each of the straight forward converging path, the left converging path, and the right converging path connected to the three-directional converging portion;

wherein the straight forward converging path is configured such that the pair of right and left rail portions provided along the straight forward converging path are discontinuous with and spaced apart from the pair of right and left rail portions provided along the downstream-side travel path of the three-directional converging portion by a predetermined straight forward rail distance in a path longitudinal direction;

wherein the left converging path is configured such that a left rail portion of the pair of right and left rail portions provided along the left converging path is continuous with a left rail portion of the pair of right and left rail portions of the downstream-side travel path, wherein the right converging path is configured such that a right rail portion of the pair of right and left rail portions provided along the right converging path is continuous with a right rail portion of the pair of right and left rail portions of the downstream-side travel path, wherein the article transport vehicle includes a guided member for converging travel that is provided at a location above the travel wheels of the travel portion and a converging state switching means which switches a state in which the guided member is guided, wherein the article transport facility further comprises a converging upper guide rail that receives the guided member and a converging travel auxiliary receiving mechanism that receives and supports the article transport vehicle traveling in the three-directional converging portion and between the pair of right and left rail portions of the straight forward converging path and the pair of right and left rail portions of the downstream-side travel path, wherein the converging upper guide rail is configured to have a left converging guide surface for causing the article transport vehicle to converge from the left converging path into the downstream-side travel path, a right converging guide surface for causing the article transport vehicle to converge from the right converging path into the downstream-side travel path, and a straight forward converging guide surface for causing the article transport vehicle to travel straight forward from the straight forward converging path into the downstream-side travel path, wherein the converging state switching mechanism is configured to switch among a left converging guide state in which the guided member is guided by the left converging guide surface, a right converging guide state in which the guided member is guided by the right converging guide surface, and a straight forward converging guide state in which the guided member is guided by the straight forward converging guide surface, wherein the left converging guide surface is configured to receive the guided member such as to limit the article transport vehicle, in the left converging travel state in which the article transport vehicle is caused to converge from the left converging path to the downstream-side travel path, from leaning toward right, wherein the right converging guide surface is configured to receive the guided member such as to limit the article transport vehicle, in the right converging travel state in which the article transport vehicle is caused to converge from the right converging path to the downstream-side travel path, from leaning toward left, wherein the converging travel auxiliary receiving mechanism is configured to receive and support the article transport vehicle traveling between the pair of right and left rail portions of the straight forward converging path and the pair of right and left rail portions of the downstream-side travel path in the straight forward converging travel state in which the article transport vehicle is caused to converge from the straight forward converging path into the downstream-side travel path.

10. The article transport facility of a ceiling installation type as defined in claim 9, wherein
the article transport vehicle further includes an auxiliary wheel at a location above the travel portion,
wherein the auxiliary wheel is configured to be switched between a received position in which the auxiliary wheel is received and supported by an auxiliary guide rail provided at a location above the three-directional converging portion and a retracted position in which the auxiliary wheel is not received by the auxiliary guide rail;
wherein the converging travel auxiliary receiving mechanism is configured to suspend and support the article transport vehicle with the auxiliary guide rail by receiving the auxiliary wheel with the auxiliary guide rail.

11. The article transport facility of a ceiling installation type as defined in claim 10,
wherein the straight forward converging guide surface is configured to define an upwardly sloped surface in a cross-sectional view taken at a plane that is perpendicular to a direction in which the converging upper guide rail extends,
wherein the guided member includes a wheel body that is rotatable about a pivot axis extending parallel to the straight forward converging guide surface in the cross-sectional view,
wherein the converging upper guide rail is configured to function as the auxiliary guide rail and the guided member is configured to function as the auxiliary wheel.

12. The article transport facility of a ceiling installation type as defined in claim 11, wherein
the guided member that functions as the auxiliary wheel is configured to be switched between the received position and the retracted position through movements along an extending direction of the pivot axis that is parallel to the straight forward converging guide surface.

13. The article transport facility of a ceiling installation type as defined in claim 9, wherein
the straight forward rail distance is defined to be smaller than a fore and aft wheel distance which is a distance in the fore and aft direction between the travel wheels provided to the travel portion of the article transport vehicle.

14. The article transport facility of a ceiling installation type as defined in claim 10, wherein
the straight forward rail distance is defined to be smaller than a fore and aft wheel distance which is a distance in the fore and aft direction between the travel wheels provided to the travel portion of the article transport vehicle.

15. The article transport facility of a ceiling installation type as defined in claim 11, wherein
the straight forward rail distance is defined to be smaller than a fore and aft wheel distance which is a distance in the fore and aft direction between the travel wheels provided to the travel portion of the article transport vehicle.

16. The article transport facility of a ceiling installation type as defined in claim 12, wherein
the straight forward rail distance is defined to be smaller than a fore and aft wheel distance which is a distance in the fore and aft direction between the travel wheels provided to the travel portion of the article transport vehicle.

* * * * *